(12) United States Patent
Koyama

(10) Patent No.: US 8,164,235 B2
(45) Date of Patent: Apr. 24, 2012

(54) PIEZOELECTRIC RESONATOR

(75) Inventor: Shinichi Koyama, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 26 days.

(21) Appl. No.: 12/667,715

(22) PCT Filed: Jul. 30, 2008

(86) PCT No.: PCT/JP2008/063652
§ 371 (c)(1),
(2), (4) Date: Jan. 5, 2010

(87) PCT Pub. No.: WO2009/020022
PCT Pub. Date: Feb. 12, 2009

(65) Prior Publication Data
US 2010/0327705 A1    Dec. 30, 2010

(30) Foreign Application Priority Data

Aug. 3, 2007 (JP) .................. 2007-203010
Sep. 21, 2007 (JP) .................. 2007-246279
Sep. 28, 2007 (JP) .................. 2007-254046

(51) Int. Cl.
*H01L 41/08* (2006.01)
(52) U.S. Cl. ........................ 310/365; 310/361
(58) Field of Classification Search .......... 310/365, 310/361, 367, 368
See application file for complete search history.

(56) References Cited

U.S. PATENT DOCUMENTS

| | | | |
|---|---|---|---|
| 7,126,255 B2* | 10/2006 | Yamaguchi et al. | 310/324 |
| 7,732,995 B2* | 6/2010 | Tsuchido et al. | 310/348 |
| 7,745,980 B2* | 6/2010 | Furue et al. | 310/365 |
| 2005/0218757 A1* | 10/2005 | Yamaguchi et al. | 310/365 |

FOREIGN PATENT DOCUMENTS

| | | |
|---|---|---|
| JP | 50-74879 | 6/1975 |
| JP | 04-196910 A | 7/1992 |
| JP | 09-98062 A | 4/1997 |
| JP | 2001-508630 A | 6/2001 |
| JP | 2001-196890 A | 7/2001 |
| JP | 2001-223556 A | 8/2001 |
| JP | 2002-111435 A | 4/2002 |
| JP | 2004-179879 A | 6/2004 |

* cited by examiner

*Primary Examiner* — Mark Budd
(74) *Attorney, Agent, or Firm* — Marvin A. Motsenbocker; Mots Law, PLLC

(57) ABSTRACT

A piezoelectric resonator includes a pair of driving electrodes and a pair of lead electrodes that are formed facing each other on the frontside and backside of a piezoelectric plate that operates in a thickness-shear vibration mode. The front and back driving electrodes are formed such that they each have one or more pairs of parallel sides and have the same shape, and their centers face each other. The parallel sides of one of the front and back driving electrodes are formed parallel with either the X-axis or the Z'-axis of the piezoelectric plate, but the parallel sides of the other driving electrodes are formed without being parallel with the X-axis and Z'-axis thereof.

8 Claims, 11 Drawing Sheets (a)

(b)

(c)

(d)

PIEZOELECTRIC RESONATOR

TECHNICAL FIELD

The present invention relates to piezoelectric resonator and specifically to the electrode structures of piezoelectric resonator.

BACKGROUND ART

In piezoelectric resonator having a thickness vibration-type piezoelectric plate such as an AT-cut crystal plate, generally a pair of driving electrodes are formed directly facing each other on the front and rear surfaces of the piezoelectric plate, and alternating voltage is applied to the driving electrodes. The characteristics of such piezoelectric resonator depend on the structure of their driving electrodes. For example, by using large-sized electrodes, their vibration region can be enlarged, their series resonance resistance can be improved, and their variable frequency range can be broadened. And further, the characteristics of piezoelectric resonator significantly depend on the characteristics of their piezoelectric plate as well. For example, in some cases the planes of their piezoelectric plate are insufficient in plane parallelism due to working conditions or variations in working. In those cases, spurious vibrations are driven intensely, and therefore the characteristics of piezoelectric resonator may be deteriorated.

As for descriptions of the deterioration in their characteristics attributed to the variations in the plane parallelism of the piezoelectric plates, a description is given in JP 2001-196890A (Patent Document 1), for example. In Patent Document 1, a structure is disclosed in which one of the counter electrodes (driving electrodes) consists of two split electrodes, and the two split electrodes roughly match their resonance frequency with that of the other counter electrode to improve the characteristics of the resonator; and the two split electrodes are electrically connected to each other by a conducting means.

The above problem is attributed to spurious vibrations coming to the surface as higher frequencies are used, and piezoelectric plates for high frequency applications in which their driving region is formed thinly are particularly susceptible to such a problem. And further, in voltage-controlled piezoelectric oscillators in which the frequency of their main vibration is varied by changing external voltage, the above problem is brought to the fore when their frequency is varied considerably. There is a high possibility that the variations in the frequency of their main vibration couple with the spurious vibration described above, which has sometimes caused the problems of the jump phenomenon of their frequency occurring and the driving of their vibration becoming unstable.

DISCLOSURE OF INVENTION

Problem to be Solved by the Invention

The present invention has been accomplished in view of such problems; therefore an object of the present invention is to provide piezoelectric resonator having excellent characteristics in which spurious vibrations are suppressed.

Means for Solving Problem

Therefore, a piezoelectric resonator according to the present invention includes a pair of driving electrodes and a pair of lead electrodes that face the front and back of a piezoelectric plate that operates in a thickness-shear vibration mode, wherein the front and back driving electrodes have one or more pairs of parallel sides, the centers of the front and back driving electrodes are positioned such that they face each other, the parallel sides of one of the front and back driving electrodes (first driving electrode) are formed parallel with either the X-axis or the Z'-axis of the piezoelectric plate, and the parallel sides of the other driving electrode (second driving electrode) are not formed parallel with either the X-axis or the Z'-axis of the piezoelectric plate.

In the above structure, since the parallel sides of one of the front and back driving electrodes (first driving electrode) are formed parallel with either the X-axis or the Z'-axis of the piezoelectric plate, and the regions facing each other around the centers of the front and back driving electrodes are secured, the driving of its main vibration having the highest vibration displacement distribution near the centers of the driving electrodes is not hindered. In addition, since the regions facing each other (regions where the front and back driving electrodes overlap each other when viewed from above) are reduced in size at the edges of the front and back driving electrodes, spurious vibrations having vibration displacement distribution in the vicinity of the edges of the driving electrodes, such as vibrations in (1, 2, 1) and (1, 1, 2) modes, which are thickness-system secondary modes, (1, 3, 1) and (1, 1, 3) modes, which are thickness-system tertiary modes, or the like, are suppressed by an influence on the vibration displacement of each spurious vibration. It should be noted that although it is preferable that the centers of the front and rear driving electrodes are disposed directly facing each other, obtaining the same effect as that described above can be expected even when their centers are displaced with respect to each other to some extent due to a production error or the like, and therefore such a structure is also included in the scope of the claims of the present invention.

In the above structure, the front and back driving electrodes may be formed such that they have the same shape.

In that case, since the front and back driving electrodes are formed such that they have the same shape in addition to the obtainment of the foregoing working effect, respective spurious vibration regions in the vicinity of the edges of the driving electrodes can be reduced while securing vibration regions around the centers of the driving electrodes without increasing the areas of the driving electrodes formed on the piezoelectric plate. That is, the spurious vibrations can be suppressed without hindering the miniaturization of the piezoelectric plate and the driving of the main vibration.

Moreover, in the structure described above, the front and back driving electrodes may be formed such that the parallel sides of either one of the front and back driving electrodes are rotated around their centers by an angle in the range of 20° to 70° from the Z'-axis (relative to Z'-axis) when viewed from above (on the principal plane of the plate).

In that case, the formation of such an angle is preferred due to an increase in its spurious vibration-suppressing effect. In particular, in the above structure, it is preferable that the parallel sides of either one of the front and back driving electrodes be rotated 45° around its center from the Z'-axis when viewed from above. Specifically, by rotating the parallel sides by an angle of 45° from the Z'-axis when viewed from above, the regions facing each other at the edges of the front and back driving electrodes become minimum, whereby the effect of suppressing each spurious vibration can be enhanced to the greatest degree.

Additionally, in the above structure, it is preferable that the driving electrodes be square in shape when viewed from above.

In that case, when the front and back driving electrodes have been rotated relative to each other, the spurious vibration displacement regions extending in the X-axis and Z'-axis of the piezoelectric plate is reliably reduced by the sides of the rotated driving electrodes orthogonal to each other, and therefore spurious vibrations can be suppressed more efficiently. And further, such a structure in which the sides of one of the driving electrodes can be formed to be parallel to the X-axis and the Z'-axis is much preferred in terms of the elimination of the suppression of the main vibration.

Furthermore, when the driving electrodes are square in shape when viewed from above, it is preferable that a square piezoelectric plate that is parallel with the X-axis and the Z'-axis is used, and each side of the piezoelectric plate is parallel with each side of one of the driving electrodes.

In that case, the areas of the driving electrodes can be extended up to the vicinity of the perimeter of the piezoelectric plate without hindering the miniaturization of the piezoelectric plate, and since the vibration displacement of the main vibration generated by the driving electrodes thus designed is obstructed by the perimeter of the piezoelectric plate, the main vibration is not suppressed.

Another piezoelectric resonator according to the present invention includes a pair of driving electrodes and a pair of lead electrodes that are formed on the frontside and backside of a piezoelectric plate that operates in the thickness-shear vibration mode, wherein one of the front and back driving electrodes is formed in the shape of a rectangle such that one pair of parallel sides are parallel with the X-axis of the piezoelectric plate and the other two parallel sides are parallel with the Z'-axis thereof, the other driving electrode is formed in the shape of a rhombus such that both of its pairs of parallel sides are not parallel with the X-axis or the Z'-axis of the piezoelectric plate, and the center of the rectangular driving electrode and the center of the rhombic driving electrode face each other. The wording "the center of the rectangular driving electrode and the center of the rhombic driving electrode face each other" means that the center of the rectangular driving electrode and the center of the rhombic driving electrode are disposed directly facing each other when the piezoelectric resonator is viewed from above.

In such a structure, the driving of its main vibration having the highest vibration displacement distribution around the centers of the driving electrodes is not hindered. Since regions directly facing each other are reduced in size at the edges of the front and back driving electrodes, spurious vibrations having vibration displacement distribution in the vicinity of the edges of the driving electrodes, such as vibrations in (1, 2, 1) and (1, 1, 2) modes, which are thickness-system secondary modes, (1, 3, 1) and (1, 1, 3) modes, which are thickness-system tertiary modes, or the like, are suppressed by an influence on the vibration displacement of each spurious vibration. In particular, since one of the front and back driving electrodes is formed in the shape of a rectangle such that both its pairs of parallel sides are parallel with the X-axis and the Z'-axis of the piezoelectric plate respectively, and the other electrode is formed in the shape of a rhombus such that both its pairs of parallel sides are not parallel with the X-axis and the Z'-axis of the plate, and the center of the rectangular driving electrode and that of the rhombic driving electrode are disposed directly facing each other, spurious vibration displacement regions extending in the X-axis and the Z'-axis direction of the piezoelectric plate can be reduced most reliably and efficiently with the sides of the rhombic driving electrode while eliminating the suppression of the main vibration with the rectangular driving electrode the sides of which are parallel with the axes of the plate, which achieves the implementation of the driving electrode structure of the piezoelectric plate in which the effect of suppressing each spurious vibration is increased. It should be noted that although it is preferable that the center of the rectangular driving electrode and that of the rhombic driving electrode are disposed directly facing to each other, the same effect as that described above can be expected even when their centers are displaced with respect to each other to some extent due to a production error or the like, and therefore such a structure is also included in the scope of the rights of the present invention.

In addition, in the above structure, it is preferable that the second (rhombic) driving electrode be thicker than the first (rectangular) driving electrode.

In that case, the effect of suppressing each spurious vibration is further enhanced by the weighting effect of the other driving electrode formed without being parallel with the X-axis and Z'-axis of the piezoelectric plate.

Furthermore, in a piezoelectric plate formed for high frequency applications, it has been often formed recently such that it has a so-called inverted mesa shape in which its vibration region is formed thinly. In such an inverted mesa-shaped piezoelectric plate, it is preferable that a boundary portion between a perimetric thick frame region and a thin vibration region, i.e., a step-height portion be formed squarely such that the portion is parallel with the X-axis and Z'-axis thereof, and the same rectangular driving electrode as that described above be formed such that both its pairs of parallel sides are parallel to the step-height portion.

In that case, the areas of the driving electrodes can be extended up to the vicinity of the perimeter of the piezoelectric plate, and the vibration displacement of its main vibration generated by the driving electrodes thus designed is obstructed by the step-height portion of the piezoelectric plate, whereby the main vibration is not suppressed.

In addition, in the above structure, notches are made at the corners of the perimeters of the driving electrodes (the corners of the driving electrodes made when viewed from above).

In that case, since the corners of the driving electrodes are notched, spurious vibrations can be kept away from the main vibration while reducing areas of the notched portions where the spurious vibrations are caused. As a result, the leakage of energy in the form of the vibrations can be suppressed further.

Next, comparative evaluations of the capabilities of some samples were done. As such samples, resonators according to the invention (inventions A, B, C, D, E, F, and G) and conventional resonators (conventional articles A, B, C, and D) were used. The evaluated capabilities were the series resonance resistance values (so-called CI values) of their main vibrations, the series resonance resistance values of their spurious vibrations, and the ratios between these resistance values.

It should be noted that as commonalities between the inventions and the conventional articles, a resonator, which vibrates to emit a fundamental wave with a frequency of 300 MHz, is used, and square driving electrodes are formed on the frontside and backside of an AT-cut crystal plate, for example. The driving electrodes are made by disposing a gold layer on a chromium underlying layer, and have a thickness of 0.2 μm. The lengths of their sides are 0.25 mm (sample A) and 0.275 mm (sample B). Or the driving electrodes are made by disposing a gold layer on a chromium underlying layer, and have a thickness of 0.3 μm. The lengths of their sides are 0.25 mm (sample C) and 0.275 mm (sample D).

In the conventional resonators (conventional articles A, B, C, and D), their front and back driving electrodes directly face each other without being displaced with respect to each other (see Table 1).

In contrast, in the resonators according to the invention (inventions A, B, C, and D), the parallel sides of their back driving electrode are rotated around its center (central point) by an angle of 20° (see Table 2), 45° (see Table 3), or 75° (see Table 4) from the Z'-axis relative to their front driving electrode.

Moreover, in the resonators according to the invention (inventions E, F, and G) of Table 5, the parallel sides of their back driving electrode are rotated around its center (central point) by an angle of 45° from the Z'-angle relative to their front driving electrode.

In inventions E, F, and G, their front and back driving electrodes are made of the same electrode material, and are square in shape (the length of each side: 0.275 mm). And further, inventions E, F, and G have a piezoelectric resonator that vibrates to emit a fundamental wave with a frequency of 300 MHz.

More specifically, in invention E, the front driving electrode is 0.25 μm thick, and the back driving electrode is 0.75 μm thick (sample E).

In invention F, the front driving electrode is 0.2 μm thick, and the back driving electrode is 0.1 μm thick (sample F).

In addition, in invention G, the front driving electrode is 0.1 μm thick, and the back driving electrode is 0.2 μm thick (sample G).

In Table 6, as the resonator according to the invention (invention H), a piezoelectric resonator is used which vibrates to emit a fundamental wave with a frequency of 200 MHz and in which the parallel sides of a back driving electrode are rotated around its center (central point) by an angle of 45° from the Z'-axis relative to a front driving electrode (sample H).

In invention H, the front and back driving electrodes are made of the same electrode material, and are square in shape (the length of each side: 0.2 mm). It should be noted that in invention H, regions where the front and back driving electrodes directly face each other (regions where the front and back driving electrodes overlap each other when the piezoelectric resonator is viewed from above) are octagonal in shape.

Furthermore, in Table 6, as a conventional resonator (conventional article E), a piezoelectric resonator is used which includes: a front driving electrode of square (0.2×0.2 mm) formed parallel with the X-axis and Z'-axis of its piezoelectric plate; and a back driving electrode of square (0.2×0.2 mm) formed parallel with the X-axis and Z'-axis thereof and which vibrates to emit a fundamental wave with a frequency of 200 MHz. And further, in conventional article E, regions where the front and back driving electrodes directly face each other (regions where the front and back driving electrodes overlap each other when the piezoelectric resonator is viewed from above) are square in shape (0.2×0.2 mm).

In Table 7, as a resonator according to the invention (invention I), a piezoelectric resonator is used which comprises:

a front rectangular driving electrode (0.15×0.268 mm) formed parallel with the X-axis and Z'-axis of its piezoelectric plate; and a back rhombic driving electrode (the length of each side: 0.215 mm) formed such that its sides are neither parallel with the X-axis nor the Z'-axis of the piezoelectric plate but both its diagonals are parallel with the X-axis and Z'-axis thereof respectively and which vibrates to emit a fundamental wave with a frequency of 200 MHz. And further, in invention I, regions where the front and back driving electrodes face each other (regions where the front and back driving electrodes overlap each other when the piezoelectric resonator is viewed from above) are octagonal in shape.

Moreover, in Table 7, as a conventional resonator (conventional article F), a piezoelectric resonator is used which includes a front rectangular driving electrode (0.15×0.268 mm) formed parallel with the X-axis and Z'-axis of its piezoelectric plate; and a back rectangular driving electrode (0.15× 0.268 mm) formed parallel with the X-axis and Z'-axis thereof and which vibrates to emit a fundamental wave with a frequency of 200 MHz. And further, in conventional article F, regions where the front and back driving electrodes face each other (regions where the front and back driving electrodes overlap each other when the piezoelectric resonator is viewed from above) are rectangular in shape (0.15×0.268 mm).

Test results are presented in Tables 1 to 8.

TABLE 1

|  | Series Resonance Resistance Value of Main Vibration (Ω) | Series Resonance Resistance Value of Spurious Vibration (Ω) | Ratio between Both Series Resonance Resistance Values |
| --- | --- | --- | --- |
| Conventional Article A (0°-Angle Rotation Article) | 15.3 | 79.56 | 5.2 |
| Conventional Article B (0°-Angle Rotation Article) | 14.5 | 50.75 | 3.5 |
| Conventional Article C (0°-Angle Rotation Article) | 14.7 | 67.62 | 4.6 |
| Conventional Article D (0°-Angle Rotation Article) | 13.4 | 44.22 | 3.3 |

TABLE 2

|  | Series Resonance Resistance Value of Main Vibration (Ω) | Series Resonance Resistance Value of Spurious Vibration (Ω) | Ratio between Both Series Resonance Resistance Values |
|---|---|---|---|
| Invention A (20°-Angle Rotation Article) | 15.9 | 109.71 | 6.9 |
| Invention B (20°-Angle Rotation Article) | 14.7 | 70.56 | 4.8 |
| Invention C (20°-Angle Rotation Article) | 15 | 130.5 | 8.7 |
| Invention D (20°-Angle Rotation Article) | 13.6 | 92.48 | 6.8 |

TABLE 3

|  | Series Resonance Resistance Value of Main Vibration (Ω) | Series Resonance Resistance Value of Spurious Vibration (Ω) | Ratio between Both Series Resonance Resistance Values |
|---|---|---|---|
| Invention A (45°-Angle Rotation Article) | 16.1 | 119.14 | 7.4 |
| Invention B (45°-Angle Rotation Article) | 15.2 | 77.52 | 5.1 |
| Invention C (45°-Angle Rotation Article) | 15.3 | 146.88 | 9.6 |
| Invention D (45°- Angle Rotation Article) | 14 | 105 | 7.5 |

TABLE 4

|  | Series Resonance Resistance Value of Main Vibration (Ω) | Series Resonance Resistance Value of Spurious Vibration (Ω) | Ratio between Both Series Resonance Resistance Values |
|---|---|---|---|
| Invention A (70°-Angle Rotation Article) | 16 | 108.8 | 6.8 |
| Invention B (70°-Angle Rotation Article) | 14.6 | 71.54 | 4.9 |
| Invention C (70°-Angle Rotation Article) | 14.8 | 134.68 | 9.1 |
| Invention D (70°-Angle Rotation Article) | 13.3 | 93.1 | 7.0 |

TABLE 5

|  | Series Resonance Resistance Value of Main Vibration (Ω) | Series Resonance Resistance Value of Spurious Vibration (Ω) | Ratio between Both Series Resonance Resistance Values |
|---|---|---|---|
| Invention E (Frontside: 0.25 μm, Backside: 0.075 μm) | 17.3 | 110.72 | 6.4 |
| Invention F (Frontside: 0.2 μm, Backside: 0.1 μm) | 16.6 | 142.76 | 8.6 |

TABLE 5-continued

| | Series Resonance Resistance Value of Main Vibration (Ω) | Series Resonance Resistance Value of Spurious Vibration (Ω) | Ratio between Both Series Resonance Resistance Values |
|---|---|---|---|
| Invention G (Frontside: 0.1 μm, Backside: 0.2 μm) | 14.3 | 150.15 | 10.5 |

TABLE 6

| | Series Resonance Resistance Value of Main Vibration (Ω) | Series Resonance Resistance Value of Spurious Vibration (Ω) | Ratio between Both Series Resonance Resistance Values |
|---|---|---|---|
| Conventional Article E (Driving electrodes: Square) | 28.0 | 397.0 | 14.2 |
| Invention H (Driving electrodes: Square) | 34.8 | 688.0 | 19.8 |

TABLE 7

| | Series Resonance Resistance Value of Main Vibration (Ω) | Series Resonance Resistance Value of Spurious Vibration (Ω) | Ratio between Both Series Resonance Resistance Values |
|---|---|---|---|
| Conventional Article F (Driving electrodes: Rectangle) | 9.0 | 42.0 | 4.7 |
| Invention I (Driving electrodes: Rectangle and Rhombus) | 9.7 | 51.3 | 5.3 |

From these test results, it is clear that when compared with the conventional resonators, the resonators according to the invention have a very high ratio between the series resonance resistance value of their main vibration and that of their spurious vibration, and therefore exhibit a considerably increased spurious vibration-suppressing effect.

In addition, it can be seen that among the resonators according to the invention, the resonator in which the 45° angle turn is made and which has the 0.3-μm-thick driving electrodes has the greatest spurious vibration-suppressing effect. From the above evaluation results, it is apparent that the spurious vibration-suppressing effect is manifested by rotating the parallel sides of one of the driving electrodes from the Z'-axis; among those subjected to comparison this time, the greatest suppression effect is produced at the 45° angle turn. And further, when the driving electrodes are 0.3 μm thick, that is, are thicker, the spurious vibration-suppressing effect tends to heighten. Moreover, from Table 5, it can be seen that the spurious vibration-suppressing effect is increased by making the back driving electrode that isn't parallel with the X-axis and Z'-axis of the piezoelectric plate thicker than the front driving electrode.

Moreover, another piezoelectric resonator according to the present invention includes a pair of driving electrodes and a pair of lead electrodes that are formed on the frontside and backside of a piezoelectric plate that operates in a thickness-shear vibration mode, wherein the front and back driving electrodes are formed such that they are of the same shape and face each other, and the driving electrodes each have one or more pairs of parallel sides formed parallel with either the X-axis or the Z'-axis of the piezoelectric plate and four or more sides which aren't formed parallel with the X-axis or the Z'-axis thereof and having the same length; and the sides which aren't parallel with the axes are formed such that they are longer than the sides parallel with the axes, or are identical to those in length.

In the above structure, the driving of its main vibration having the highest vibration displacement distribution around the centers of the driving electrodes is not hindered. Since regions directly facing each other are reduced in size at the edges of the front and back driving electrodes, spurious vibrations having vibration displacement distribution in the vicinity of the edges of the driving electrodes, such as vibrations in (1, 2, 1) and (1, 1, 2) modes, which are thickness-system secondary modes, (1, 3, 1) and (1, 1, 3) modes, which are thickness-system tertiary modes, or the like, are suppressed by an influence on the vibration displacement of each spurious vibration. In particular, since the front and back driving electrodes are formed such that they are of the same shape and face each other, and the driving electrodes each have one or more pairs of parallel sides formed parallel with either the X-axis or the Z'-axis of the piezoelectric plate and four or more sides which aren't formed parallel with the X-axis or Z'-axis thereof and having the same length, and the sides which aren't parallel with the axes are formed such that they are identical with the sides which are parallel with the axes in length or are longer than those, the vibration displacement regions of the spurious vibrations extending the X-axis and Z'-axis of the piezoelectric plate can be reduced most reliably and efficiently with their four sides or more being longer than their parallel sides and not formed parallel with either axis while preventing the suppression of the main vibration with their one or more pairs of parallel sides formed parallel with either axis, which achieves the implementation of the driving electrode structure of the piezoelectric resonator in which the effect of suppressing each spurious vibration is increased.

Next, comparative evaluations of the capabilities of resonators according to the invention (inventions J and K) and conventional resonators (conventional articles G and H) were done. The evaluated capabilities were the series resonance resistance values (so-called CI values) of their main vibrations, the series resonance resistance values of their spurious vibrations, and the ratios between these resistance values.

Invention J is a piezoelectric resonator that vibrates to emit a fundamental wave with a frequency of 200 MHz, and has equilaterally octagonal driving electrodes (the length of each side: 0.124 mm).

On the other hand, conventional article G is a piezoelectric resonator that vibrates to emit a fundamental wave with a frequency of 200 MHz, and has square driving electrodes (the length of each side: 0.3 mm).

Invention K is a piezoelectric resonator that vibrates to emit a fundamental wave with a frequency of 300 MHz, and has equilaterally octagonal driving electrodes (the length of each side: 0.124 mm).

On the other hand, conventional article H is a piezoelectric resonator that vibrates to emit a fundamental wave with a frequency of 300 MHz, and has square driving electrodes (the length of each side: 0.3 mm).

It should be noted that as commonalities between inventions J and K and conventional articles G and H, the driving electrodes are formed on the frontside and backside of an AT-cut crystal plate such that they have a thickness of 0.2 μm, and are made by disposing a gold layer on a chromium underlying layer.

Their test results are presented in Table 8.

TABLE 8

| | Series Resonance Resistance Value of Main Vibration (Ω) | Series Resonance Resistance Value of Spurious Vibration (Ω) | Ratio between Both Series Resonance Resistance Values |
|---|---|---|---|
| Conventional Article G (200 MHz) | 8.3 | 29.0 | 3.5 |
| Conventional Article H (300 MHz) | 10.8 | 40.6 | 3.8 |
| Invention J (200 MHz) | 8.4 | 41.1 | 4.9 |
| Invention K (300 MHz) | 10.9 | 73.2 | 6.7 |

From these test results, it is clear that when compared with the conventional resonators (conventional articles G and H), the resonators according to the invention (inventions J and K) are very high in the ratio between the resistance value of their main vibration and that of their spurious vibration and therefore exhibit a considerably increased spurious vibration-suppressing effect.

Moreover, in the foregoing structure, it is preferable that a square piezoelectric plate that is parallel with the X-axis and the Z'-axis is used and any sides are disposed parallel with the parallel sides.

In that case, the areas of the driving electrodes can be extended up to the vicinity of the perimeter of the piezoelectric plate without hindering the miniaturization of the piezoelectric plate, and since the vibration displacement of the main vibration generated by the driving electrodes thus designed is obstructed by the perimeter of the piezoelectric plate, the main vibration is not suppressed.

Furthermore, in the foregoing structure, piezoelectric plates formed for high frequency applications have often been formed recently such that they have a so-called inverted mesa shape in which only a vibration region is formed thinly. In the inverted mesa-shaped piezoelectric plate, it is preferable that a boundary portion between a perimetric thick frame region and a thin vibration region, i.e., a step-height portion be formed such that it is square in shape, is parallel with the X-axis and Z'-axis thereof, and is parallel with the parallel sides of the driving electrodes.

In that case, the areas of the driving electrodes can be extended relative to the thin vibration region of the piezoelectric plate up to the vicinity of the perimeter of the plate, and its main vibration is not suppressed since the vibration displacement of the main vibration generated by the driving electrodes thus designed is obstructed by the step-height portion of the plate.

In addition, in the above structure, it is preferable that the piezoelectric plate be formed such that it has an inverted mesa shape, and has a thin vibration region at its center and a thick frame region at its perimeter, and the center of its thin vibration region and the centers of the front and back driving electrodes lie at the same position.

In that case, since variations in plane parallelism due to a difference in etching rates and so on hardly occur at the center of the thin vibration region of the piezoelectric plate, the influence of the spurious vibrations resulting from the variations in its plane parallelism can be suppressed more efficiently by disposing the center of the vibration region and centers of the driving electrodes to face each other. In particular, when the piezoelectric plate made of crystal or the like is shaped into an inverted mesa by wet etching, a sloped thickness decrement region is formed near the boundary between the thin vibration region and the thick frame region due to a difference in etching rates, and therefore there is apprehension that the plane parallelism of the vibration region varies. Thus, in order to suppress the spurious vibrations, it is most preferable to form the driving electrodes at the center of the vibration region unaffected by such a thickness decrement region.

As described above, according to the invention, the influence of the variations in its plane parallelism is brought to the fore by thinly forming the driving region of the piezoelectric plate, the foregoing structures are suitably used to suppress spurious vibrations caused at piezoelectric resonator for high frequency applications that vibrate to emit a fundamental wave with a frequency of 150 MHz or higher, and spurious vibrations can be suppressed extremely easily and efficiently only by changing the shape of driving electrodes without using any particular adjusting method in particular. And further, the foregoing structures are suitably used to suppress spurious vibrations caused at piezoelectric resonator used at voltage-controlled piezoelectric oscillators in which the frequencies of their main vibrations are varied by changing external voltages, the coupling between main vibration and spurious vibration and the jump phenomena of frequencies are eliminated, and the stabilization of oscillation frequencies can be effected.

Furthermore, another piezoelectric resonator according to the invention includes a pair of driving electrodes and a pair of lead electrodes that are formed facing the frontside and backside of a piezoelectric plate that operates in a thickness-shear vibration mode, wherein the centers of the front and back driving electrodes face each other, and the sides of the front driving electrode and the sides of the back driving electrode overlap when the piezoelectric resonator is viewed from above.

According to the invention, since the pair of driving electrodes and the pair of lead electrodes are formed facing the frontside and backside of the piezoelectric plate, and the centers of the front and back driving electrodes face each other, and the sides of the front driving electrode and the sides of the back driving electrode overlap each other when the piezoelectric resonator is viewed from above, the spurious vibrations can be suppressed without hindering the driving of the main vibration having the highest vibration displacement distribution around the centers of the driving electrodes.

Effect of the Invention

As described above, according to the present invention, piezoelectric resonator can be obtained in which spurious vibrations are suppressed and which have excellent characteristics.

DESCRIPTION OF REFERENCE NUMERALS

11, 14, 21, and 24 crystal plate (piezoelectric plate)
12, 13, 22, and 23 driving electrode

BEST MODE FOR CARRYING OUT THE INVENTION

Embodiment 1

Figure 1:
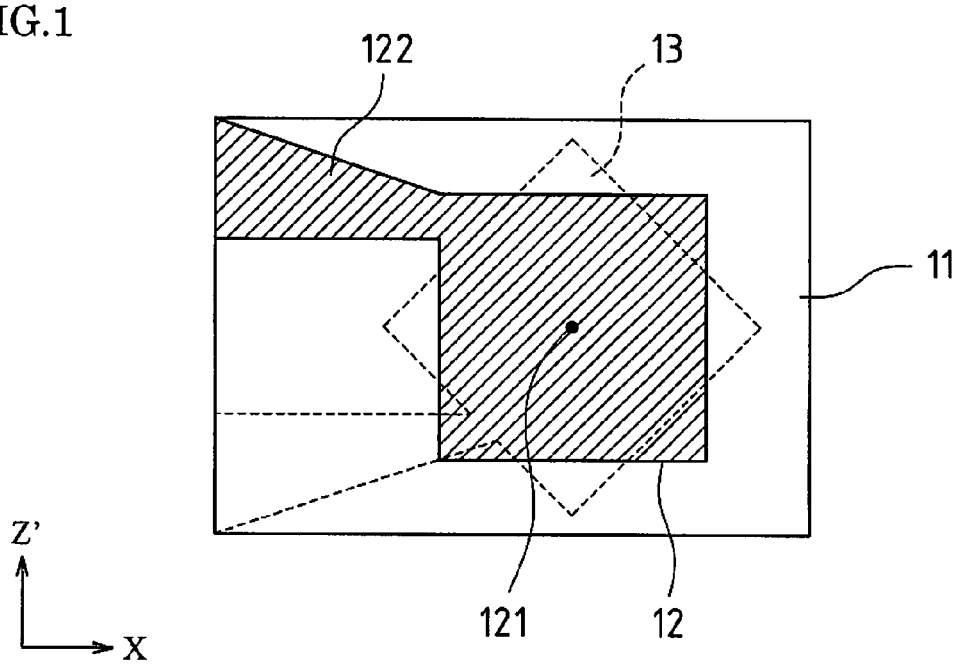
FIG. 1 is a schematic plan view of a piezoelectric plate according to Embodiment 1 of the present invention.
Figure 2:
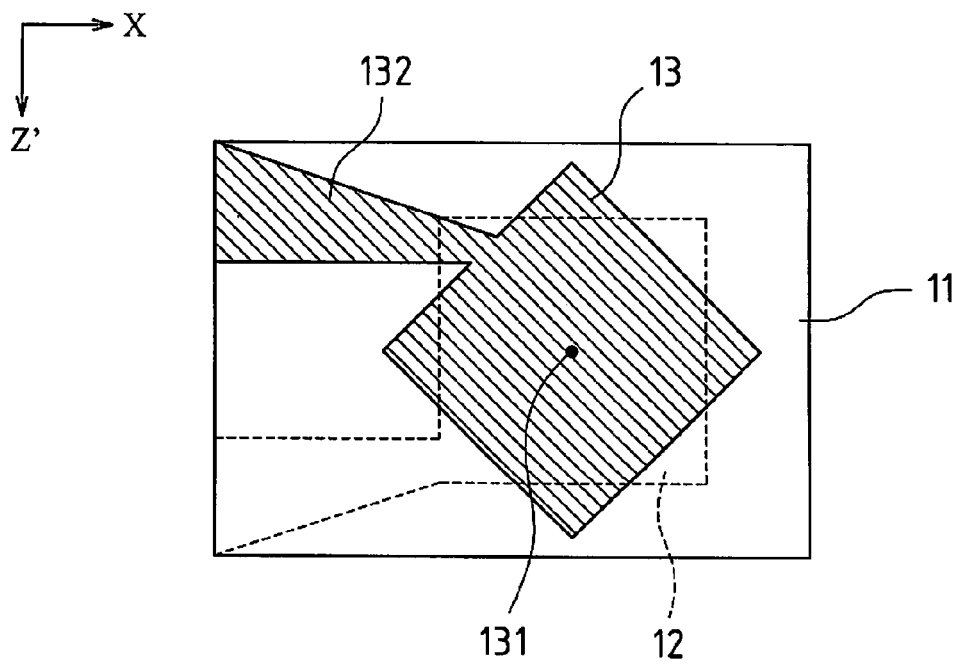
FIG. 2 is a bottom view of the piezoelectric plate of FIG. 1.

Embodiment 1 of the present invention will be described below with reference to the drawings. In this embodiment, a case will be described where structures according to the invention are applied to AT-cut crystal resonator that operate in a thickness-shear vibration mode. FIG. 1 is a plan view of a piezoelectric plate according to Embodiment 1 of the invention, and FIG. 2 is a bottom view of the piezoelectric plate of FIG. 1.

As the piezoelectric plate 11 a rectangular and flat-shaped, AT-cut crystal plate (that generates thickness-shear vibration) is used; in the central regions of the front and rear surfaces of the plate, driving electrodes 12 and 13, having a substantially square shape when viewed from above, are formed, respectively. The driving electrodes 12 and 13 are formed such that they have the same shape and area, for example and that the centers 121 and 131 of the electrodes 12 and 13 directly face each other with the piezoelectric plate 11 disposed therebetween. The piezoelectric plate 11 is provided such that the direction of its long sides represents the X-axis and the direction of its short sides represents the Z'-axis, for example. The driving electrode 12 is formed such that two sides are parallel with the X-axis and the other two sides are parallel with the Z'-axis, and the driving electrode 13 is formed such that no side is parallel with the X-axis or the Z'-axis.

That is, in Embodiment 1, the piezoelectric plate 11 has the following characteristic structure: the driving electrodes 12 and 13 have a square shape, so are formed such that they have the same shape consisting of two pairs of parallel sides; the driving electrode 12 is formed such that the two pairs of parallel sides are parallel with the X-axis and the Z'-axis of the piezoelectric plate 11 respectively; the driving electrode 13 is formed such that the two pairs of parallel sides are not parallel with the X- and Z'-axis of the piezoelectric plate 11; and the driving electrode 13 is rotated around the center 121 of the driving electrode 12 by an angle in the range of 20° to 70° when viewed from above (on the principal plane of the plate 12). It should be noted that in this embodiment, a structure in which the rotation is made by an angle of 45° is disclosed, and therefore at the edges of the driving electrodes 12 and 13, regions that are not directly facing each other (regions where the front and back driving electrodes 12 and 13 don't overlap each other when the crystal resonator is viewed from above)

become maximum in area (regions where the edges of the driving electrodes 12 and 13 directly face each other become minimum). As a result, spurious vibrations having vibration displacement distribution in the vicinity of the edges of the driving electrodes 12 and 13, for example, vibrations in (1, 2, 1) and (1, 1, 2) modes, which are thickness-system secondary modes, (1, 3, 1) and (1, 1, 3) modes, which are thickness-system tertiary mode, or the like, are suppressed most efficiently by an influence on the vibration displacements.

Furthermore, lead electrodes 122 and 132 are formed from the driving electrodes 12 and 13 to a section of the perimeter of the piezoelectric plate 11. The driving electrodes 12 and 13 and the lead electrodes 122 and 132 each have a laminated structure in which a chromium layer and a gold layer, for example, are disposed, and are formed by vacuum evaporation or sputtering; however, metallic materials for these electrodes are not limited to such metals.

The piezoelectric plate 11 is mounted in a package (not shown), such as a ceramic package, in a manner that electromechanically joins the plate 11 to the package by the use of a conductive resin adhesive or a conductive bonding agent such as a metallic bump or a plating bump. Then predetermined stabilizing treatment, such as heat treatment, is conducted, following which the mouth of the package is hermetically sealed with a covering (not shown) by means of seam joining, beam joining, brazing, glass sealing, or the like, whereby the fabrication of the piezoelectric resonator (in this case, the AT-cut crystal resonator) is completed.

In the structure described above, the two pairs of parallel sides of the driving electrodes 12 are formed parallel with the X-axis and the Z'-axis of the piezoelectric plate 11 respectively, and the securement of regions directly facing each other around the centers 121 and 131 of the driving electrodes 12 and 13 is achieved, whereby the driving of a main vibration having the highest vibration displacement distribution around the centers 121 and 131 of the driving electrodes 12 and 13 is not hindered. Additionally, since the regions directly facing each other are small at the edges of the front and rear driving electrodes 12 and 13, spurious vibrations having vibration displacement distribution in the vicinity of the edges of the driving electrodes 12 and 13, such as vibrations in (1, 2, 1) and (1, 1, 2) modes, which are thickness-system secondary modes, (1, 3, 1) and (1, 1, 3) modes, which are thickness-system tertiary modes, or the like, are suppressed by an influence on the vibration displacement of each spurious vibration. It should be noted that although it is preferable that the front and rear driving electrodes 12 and 13 be formed such that their centers 121 and 131 directly face each other, it can be expected that the same effect as that described above will be obtained even when they are not facing each other to some extent on account of a production error and so on.

Moreover, since the front and back driving electrodes 12 and 13 are formed such that they have the same shape, respective spurious vibration regions in the vicinity of the edges of the driving electrodes 12 and 13 can be reduced in size while securing the vibration regions around the centers of the driving electrodes 12 and 13 without enlarging the areas of the driving electrodes 12 and 13 formed on the piezoelectric plate 11. That is, the spurious vibrations can be suppressed without hindering the miniaturization of the piezoelectric plate 11 and the driving of the main vibration.

In Embodiment 1, although the square-shaped driving electrodes 12 and 13 are disclosed, their shape is not limited to such a shape; they only have to have at least one pair of parallel sides. For example, as shown in FIG. 3(a), the driving electrodes 12 and 13 may have a rectangular shape and as shown in FIG. 3(b), they may have a polygonal shape such as a hexagonal shape. As shown in FIG. 3(c), curved sides can be employed. And further, shapes can be used which are formed by combining any of these shapes.

Although Embodiment 1 of the invention shows the case where the spurious vibrations are suppressed by forming the front and back driving electrodes such that they have the same shape, forming the two parallel sides of one of the driving electrodes parallel with either the X-axis or the Z'-axis of the piezoelectric plate, and rotating the other driving electrode around its center by an angle in the range of 20° to 70° when viewed from above such that the parallel sides of the other driving electrode are not parallel with the X-axis or the Z'-axis of the piezoelectric plate, an electrode structure with the same spurious vibration-suppressing effect as that described above can be formed even by using the following method: as shown in FIG. 3(d), the front-side driving electrode 12 is formed such that it has a rectangular shape in which its short sides and its long sides are parallel with the X-axis and t the Z'-axis of the piezoelectric plate respectively; the back-side driving electrode 13 is formed such that it has rhombic shape in which no sides are parallel with the X-axis or the Z'-axis of the piezoelectric plate; and the center of the front-side rectangular driving electrode 12 and that of the back-side rhombic driving electrode 13 face each other. Spurious vibration displacement regions extending in the directions of the X-axis and Z'-axis of the piezoelectric plate 11 can be reduced most reliably and efficiently by the sides of the rhombic driving electrode 13 while eliminating the suppression of its main vibration with the rectangular driving electrode 12 in which its short sides and long sides are along the X-axis and Z'-axis of the piezoelectric plate 11 respectively, which achieves the implementation of the driving electrode structure of the piezoelectric plate in which the effect of suppressing respective spurious vibrations is increased.

Figure 4:
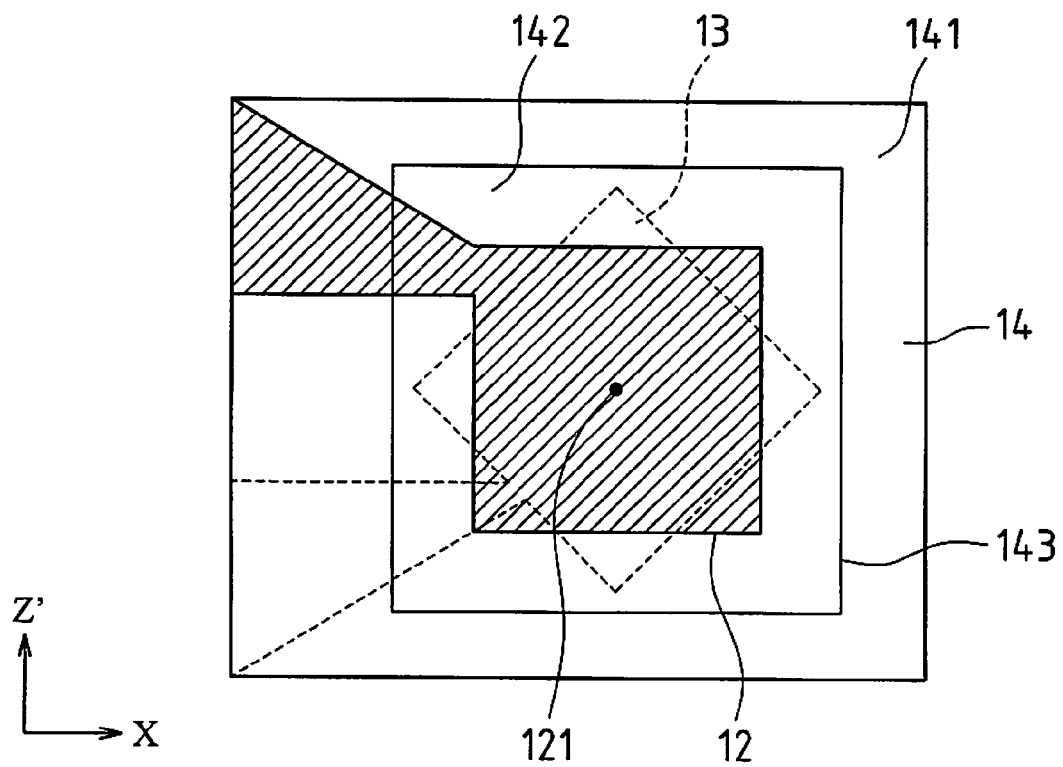
FIG. 4 is a schematic plan view of a piezoelectric plate that is a variation of the piezoelectric plate according to Embodiment 1.

The piezoelectric plates according to the invention are not limited to the flat-shaped plates illustrated in Embodiment 1; as shown in FIG. 4, an inverted mesa-shaped plate can be fabricated in which there is a thin vibration region at its center and a thick frame region at its perimeter. That is, in piezoelectric plates fabricated for high frequency applications, they have often been fabricated recently such that they have a so-called inverted mesa shape in which only a vibration region is formed thinly by etching. In such an inverted mesa-shaped piezoelectric plate 14, a step-height portion 143, which is a boundary portion between the perimetric thick frame region 141 and the thin vibration region 142, is formed squarely such that the portion is parallel with the X-axis and the Z'-axis and is therefore parallel to the two pairs of parallel sides of the driving electrodes 12. For the driving electrode 13, as in the case of Embodiment 1, its two pairs of parallel sides are rotated from the Z'-axis by an angle of 45°. The use of such a structure also makes it possible to suppress spurious vibrations caused at inverted mesa-shaped piezoelectric plates for high frequency applications extremely easily and efficiently. In addition, the areas of the driving electrodes 12 and 13 can be extended relative to the thin vibration region 142 of the piezoelectric plate 14 such that the driving electrodes 12 and 13 are present near the perimeter of the piezoelectric plate 14, and a main vibration generated by the driving electrodes 12 and 13 thus designed is not suppressed because the vibration displacement of the main vibration is blocked by the step-height portion 143 of the piezoelectric plate 14. And further, since the inverted mesa-shaped portion 14 of FIG. 4 is shaped squarely when viewed from above, further securement of the vibration region 142 can be done, and the dimensions of the driving electrodes 12 and 13 can be set to large values. As a result, the properties of the main vibration of the crystal plate 14 can be improved.

It should be noted that although the inverted mesa-shaped portion of FIG. 4 (the thin vibration region located at the center of piezoelectric plate 14) is shaped squarely when viewed from above, its shape is not limited to such a shape; it may be round in shape when viewed from above. In this case, the inverted mesa-shaped portion has no corner, and therefore the appearance of cracks can be prevented.

Figure 5:
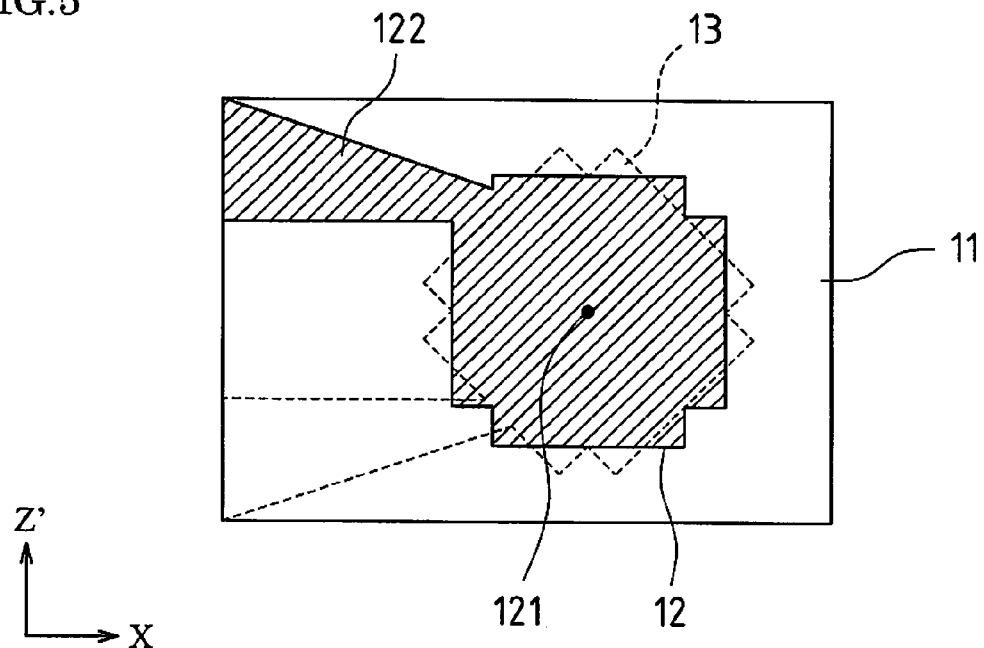
FIG. 5 is a schematic plan view of a piezoelectric plate that is another variation of the piezoelectric plate according to Embodiment 1.
Figure 6:
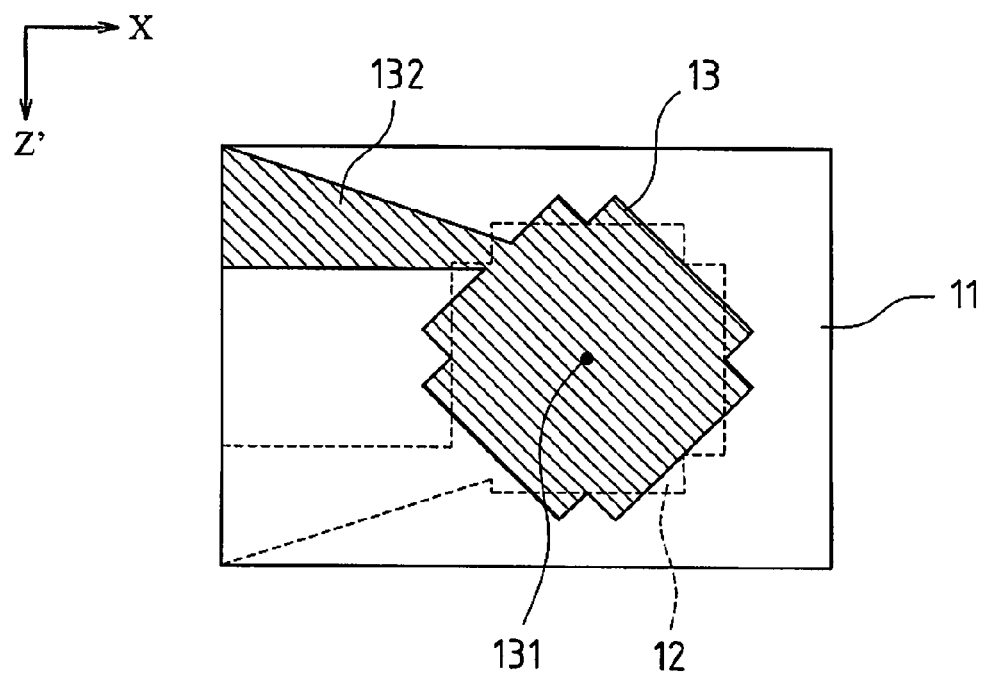
FIG. 6 is a bottom view of the piezoelectric plate of FIG. 5.

Moreover, the shape of the driving electrodes 12 and 13 is not limited to the shapes illustrated in FIGS. 1 and 2; for example, they can have a shape illustrated in FIG. 5 or 6. In the driving electrodes 12 and 13 having the shape illustrated in FIG. 5 or 6, notches are made at the corners of their perimeters (the corners of their perimeters in the vertical direction). It should be noted that it is needless to say that such a notched structure can also be applied to the driving electrodes 12 and 13 of FIGS. 3(*a*) to 3(*d*).

By notching the corners of the perimeters of the driving electrodes 12 and 13, the spurious vibration regions can be kept away from the main vibration region while reducing the areas where the spurious vibrations are caused by the notched portions, which makes it possible to further suppress the leakage of energy in the form of the vibrations.

In Embodiment 1, the structures of the respective plates are characterized in that the driving electrode 13 is formed such that the respective pairs of parallel sides are not parallel with the X-axis and Z'-axis of the piezoelectric plate, and is rotated around the center 121 of the driving electrode 12 by an angle in the range of 20° of 70° relative to the driving electrode 12 when viewed from above. Then, with this as a basis, comparative evaluations of the capabilities of resonator samples were done. As such resonators were used resonator in which the turns are made at angles of 20°, 45°, and 70° (see inventions A, B, C, D, E, F, and G presented in Tables 2 to 5) and conventional resonators in which the turn is not made (see conventional articles A, B, C, and D presented in Table 1). The evaluated capabilities were the series resonance resistance values of their main vibrations (so-called C1 values), the series resonance resistance values of their spurious vibrations, and the ratios between both the resistance values.

It should be noted that commonalities between the resonators (the inventions and the conventional articles) presented in Table 1 to 4 are, for example, the use of the crystal resonator that vibrates to emit a fundamental wave with a frequency of 300 MHz and the formation of the square driving electrodes 12 and 13 on the front and rear surfaces of the AT-cut crystal plate. The driving electrodes 12 and 13 are each formed by disposing a gold layer on a chromium underlying layer, the thicknesses of the electrode films are set to 0.2 μm, and the lengths of their sides in the vertical direction are set to 0.25 mm (sample A) or 0.275 mm (sample B); or the driving electrodes 12 and 13 are each formed by disposing a gold layer on a chromium underlying layer, the thicknesses of the electrode films are set to 0.3 μm, and the lengths of their sides in horizontal directions are set to 0.25 mm (sample C) or 0.275 mm (sample D).

In conventional articles A, B, C, and D, their front and back driving electrodes directly face each other (see Table 1).

On the other hand, as the resonators according to the invention presented in Table 2 to 4 (inventions A, B, C, and D), resonators are used in which the parallel sides of each back-side driving electrode 13 are rotated around its center (central point) by an angle of 20° (see Table 2), 45° (see Table 3), or 70° (see Table 4) from each Z'-axis relative to each front-side driving electrode 12.

In the resonators according to the invention presented in Table 5 (inventions E, F, and G), the parallel sides of each back-side driving electrode 13 are rotated around its center (central point) by an angle of 45° from each Z'-axis relative to each front-side driving electrode 12.

The front and back driving electrodes 12 and 13 of inventions E, F, and G are made of the same materials, and are formed squarely such that the length of each side is 0.275 mm. And further, in Table 5, as inventions E, F, and G piezoelectric resonators that vibrate to emit a fundamental wave with a frequency of 300 MHz are used.

More specifically, invention E is a piezoelectric resonator that is fabricated such that the front-side driving electrode 12 is 0.25 μm in thickness and the back-side driving electrode 13 is 0.075 μm in thickness (sample E).

Invention F is a piezoelectric resonator that is fabricated such that the front-side driving electrode 12 is 0.2 μm in thickness and the back-side driving electrode 13 is 0.1 μm in thickness (sample F).

Invention G is a piezoelectric resonator that is fabricated such that the front-side driving electrode 12 is 0.1 μm in thickness and the back-side driving electrode 13 is 0.2 μm in thickness (sample G).

In Table 6, as the resonator according to the invention having the structure illustrated in FIG. 1 (invention H) a crystal resonator which vibrates to emit a fundamental wave with a frequency of 200 MHz is used in which the parallel sides of one of the driving electrodes (in FIG. 1, the back-side driving electrode 13) is rotated around its center (central point) by an angle of 45° from the Z'-axis relative to the front-side driving electrode 12 (sample H).

In invention H, the front and back driving electrodes 12 and 13 are made of the same materials, and are formed squarely such that the length of their sides is 0.2 mm. It should be noted that in invention H, regions where the front-side and back-side driving electrodes 12 and 13 directly face each other (regions where they overlap each other when the crystal resonator is viewed from above) are octagonal in shape. In addition, as shown in FIG. 1, the front-side and back-side driving electrodes 12 and 13 overlap each other at any of their sides when the crystal resonator is viewed from above.

Moreover, in Table 6, as the conventional resonator (conventional article E), a piezoelectric resonator is used which comprises:

a front-side square driving electrode (0.2×0.2 mm) formed parallel with the X-axis and Z'-axis of its piezoelectric plate; and a back-side square driving electrode (0.2×0.2 mm) formed parallel with the X-axis and Z'-axis thereof and which vibrates to emit a fundamental wave with a frequency of 200 MHz. It should be noted that in conventional article E, regions where the front-side and back-side driving electrodes face each other (regions where they overlap each other when the piezoelectric resonator is viewed from above) are square in shape (0.2×0.2 mm).

Figure 3:
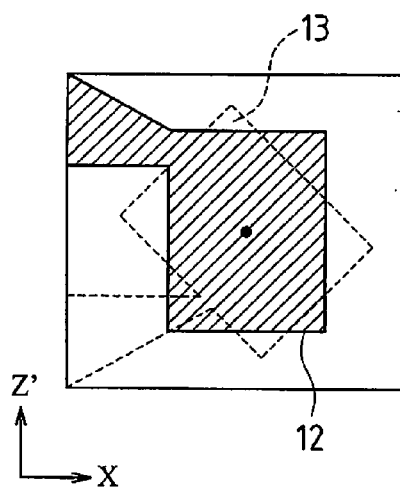
FIG. 3 consists of FIGS. 3(*a*) to 3(*d*), which are schematic plan views of piezoelectric plates that are variations of the piezoelectric plate according to Embodiment 1.
Figure 3:
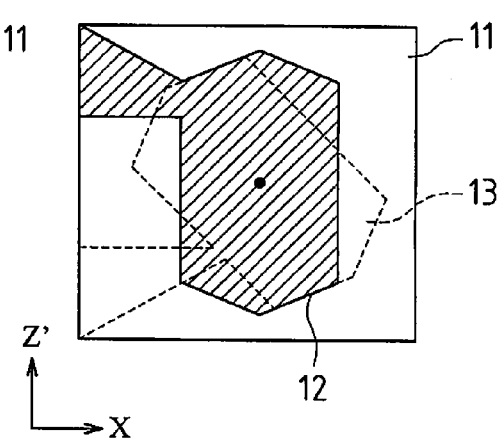
Figure 3:
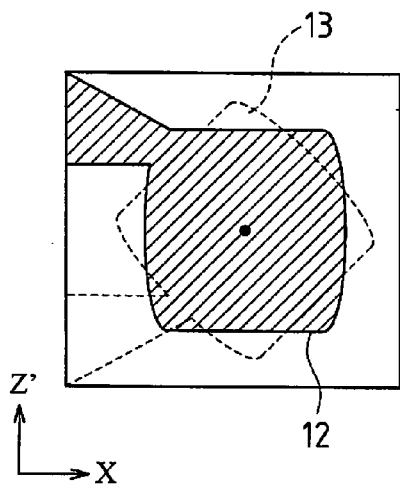
Figure 3:
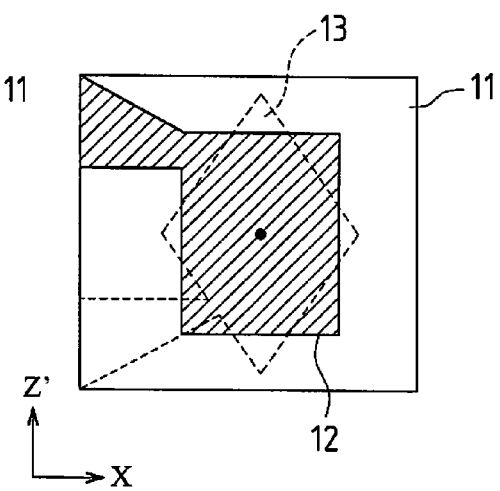

In Table 7, as the resonator according to the invention having the structure illustrated in FIG. 3(*d*) (invention I) a piezoelectric resonator which includes the front-side rectangular driving electrode 12 (0.15×0.268 mm) formed parallel with the X-axis and Z'-axis of its piezoelectric plate is used; and the back-side rhombic driving electrode 13 (the length of its four sides: 0.215 mm) is formed such that it is not parallel with the X-axis or Z'-axis thereof but its two diagonals are parallel with the X-axis and Z'-axis thereof respectively and which vibrates to emit a fundamental wave with a frequency of 200 MHz (sample H). It should be noted that in invention I, regions where the front-side and back-side driving electrodes 12 and 13 directly face each other (regions where they overlap each other when the crystal resonator is viewed from above) are octagonal in shape. In addition, as shown in FIG. 3, the front-side and back-side driving electrodes 12 and 13 overlap each other at any of their sides when the crystal resonator is viewed from above.

Furthermore, in Table 7, as the conventional resonator (conventional article F) a piezoelectric resonator which includes a front-side rectangular driving electrode (0.15× 0.268 mm) formed parallel with the X-axis and Z'-axis of its piezoelectric plate is used; and a back-side rectangular driving electrode (0.15×0.268 mm) is formed parallel with the X-axis and Z'-axis thereof and which vibrates to emit a fundamental wave with a frequency of 200 MHz. It should be noted that in conventional article F, regions where the front-side and back-side driving electrodes directly face each other (regions where they overlap each other when the piezoelectric resonator is viewed from above) are rectangular in shape (0.15×0.268 mm).

As described above, in inventions H and I of Table 6 and 7, since the pair of driving electrodes 12 and 13 and the pair of lead electrodes 122 and 132 are formed on the frontside and backside of the piezoelectric plate 11 such that the driving electrodes 12 and 13 face each other with the plate 11 disposed therebetween and the lead electrodes 122 and 132 face each other with the plate 11 disposed therebetween, and the centers of the front and back driving electrodes 12 and 13 face each other, and the sides of the front-side driving electrode 12 and those of the back-side driving electrode 13 overlap each other when the crystal resonator is viewed from above, spurious vibrations can be suppressed without hindering the driving of a main vibration with the highest vibration displacement distribution around the centers of the driving electrodes 12 and 13.

From the foregoing test results, it is clear that when compared with the conventional resonators (see conventional articles A, B, C, D, E, and F of Table 1), the resonators according to the embodiment (see inventions A, B, C, D, H, and I of Tables 2, 3, 4, 6, and 7) have a very high ratio between the resistance value of their main vibration and that of their spurious vibration, and therefore it can be seen that their spurious vibration-suppressing effect is increased considerably.

In addition, it can be seen that among the resonators according to the embodiment, the 45°-angle turn article with the 0.3-μm-thick electrodes (see Table 3) has the greatest spurious vibration-suppressing effect. It is apparent from the foregoing evaluation results that the rotation of the parallel sides of one of the two driving electrodes from the Z'-axis produces a spurious vibration-suppressing effect and among the samples compared this time, the 45°-angle turn article had the greatest spurious vibration-suppressing effect. And further, the samples with the 0.3-μm-thick driving electrodes, that is, the ones with the thicker driving electrodes tend to have greater spurious vibration-suppressing effect. Still further, it can be seen from Table 5 that by making the back-side driving electrode that is not parallel with the X-axis and Z'-axis of the piezoelectric plate thicker than the front-side driving electrode, the spurious vibration-suppressing effect is enhanced.

Figure 7:
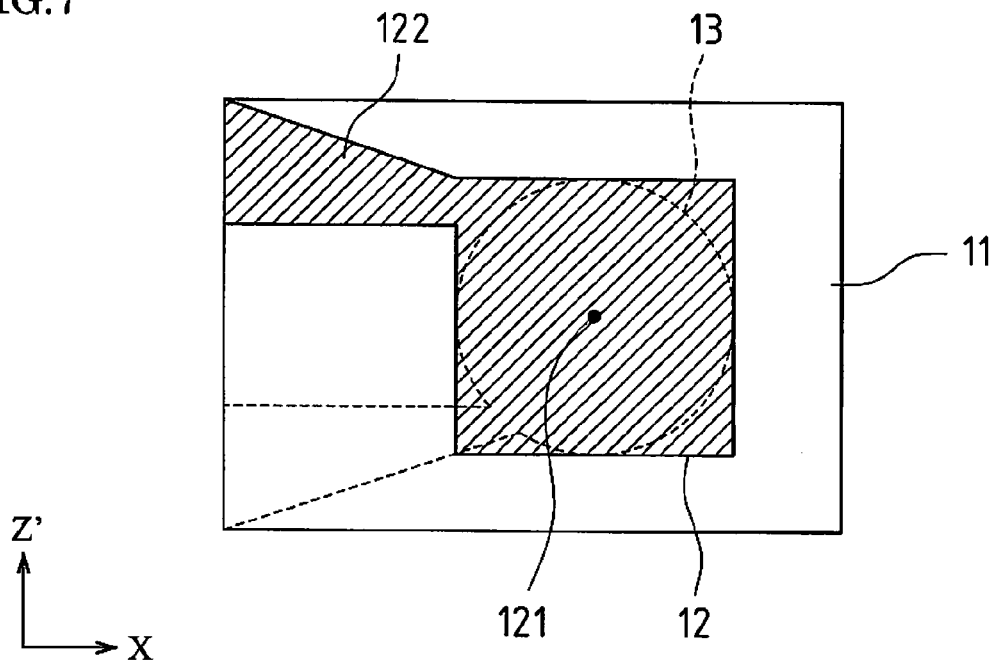
FIG. 7 is a schematic plan view of a piezoelectric plate that is a variation of the piezoelectric plate according to Embodiment 1.
Figure 8:
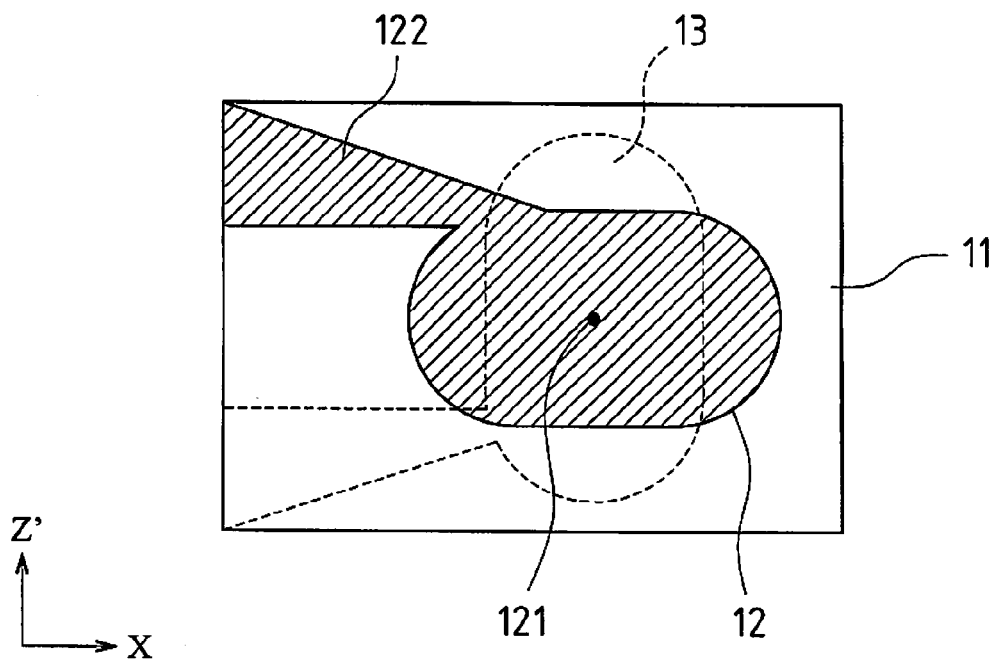
FIG. 8 is a schematic plan view of a piezoelectric plate that is a variation of the piezoelectric plate according to Embodiment 1.

Further, as described above, in this embodiment, although all the sides of the driving electrodes 12 and 13 other than those of FIG. 3(c) are straight sides, the shape of their sides is not limited to such a shape; as shown in FIG. 3(c), their sides may be curved. And further, at least one of the driving electrodes 12 and 13 may be round in shape when viewed from above (see FIG. 7) or elliptical in shape when viewed from such a direction (see FIG. 8). It should be noted that in FIG. 7, the driving electrode 13 is inscribed in the driving electrode 12 when viewed from above. In this case, since there is no corner (edge) at portions where the front and back driving electrodes 12 and 13 do not overlap each other when viewed from above, the use of such a structure is much preferable in order to suppress spurious vibrations.

Furthermore, as described above, according to the present invention, the sides of either the driving electrode 12 or the driving electrode 13 are parallel with the X-axis and the Z'-axis. It is not preferable that none of the sides of the driving electrodes 12 and 13 is not parallel with either the X-axis or the Z'-axis because spurious vibrations occur due to the fact that none of the sides of the driving electrodes 12 and 13 is not parallel with either the X-axis or the Z'-axis.

Figure 9:
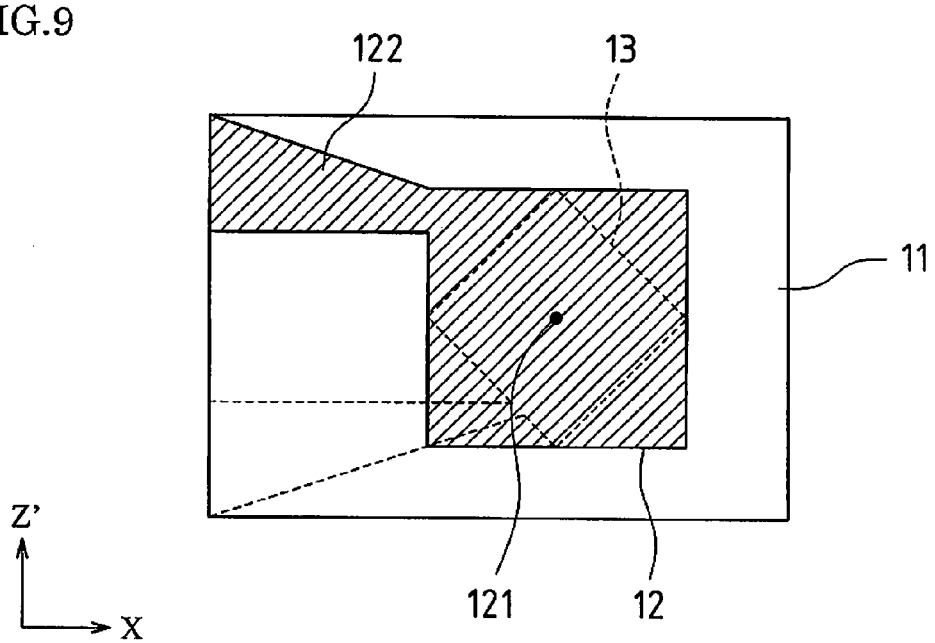
FIG. 9 is a schematic plan view of a piezoelectric plate that is a variation of the piezoelectric plate according to Embodiment 1.
Figure 10:
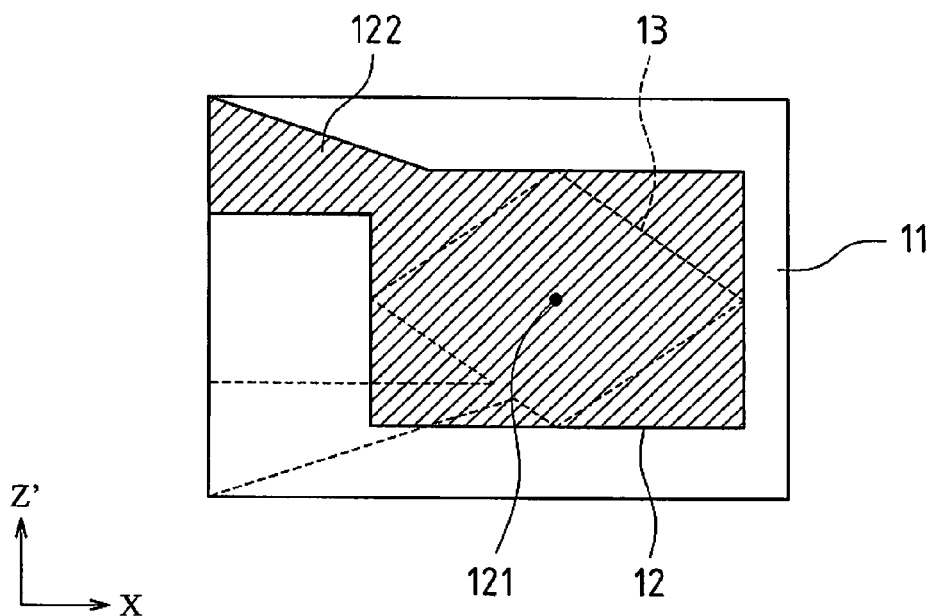
FIG. 10 is a schematic plan view of a piezoelectric plate that is a variation of the piezoelectric plate according to Embodiment 1.

Moreover, although the front-side and back-side driving electrodes 12 and 13 of the crystal resonators according to the embodiment of Tables 7 and 8 overlap each other at any of their sides when the crystal resonator is viewed from above, the sides of the front-side driving electrode 12 may be in contact with the corners of the back-side driving electrode 13 when viewed from above, as shown in FIGS. 9 and 10. It should be noted that in FIG. 9, the driving electrodes 12 and 13 are formed in the shape of a rectangle (square) when viewed from above; in FIG. 10, the driving electrode 12 is formed such that it has a rectangular shape consisting of two long sides and two short sides when viewed from above, and the driving electrode 13 is formed in the shape of a rhombus. As for the relationship between the driving electrodes 12 and 13 of FIGS. 9 and 10, the perimeter of the driving electrode 12 circumscribes the driving electrode 13 when viewed from above.

Figure 11:
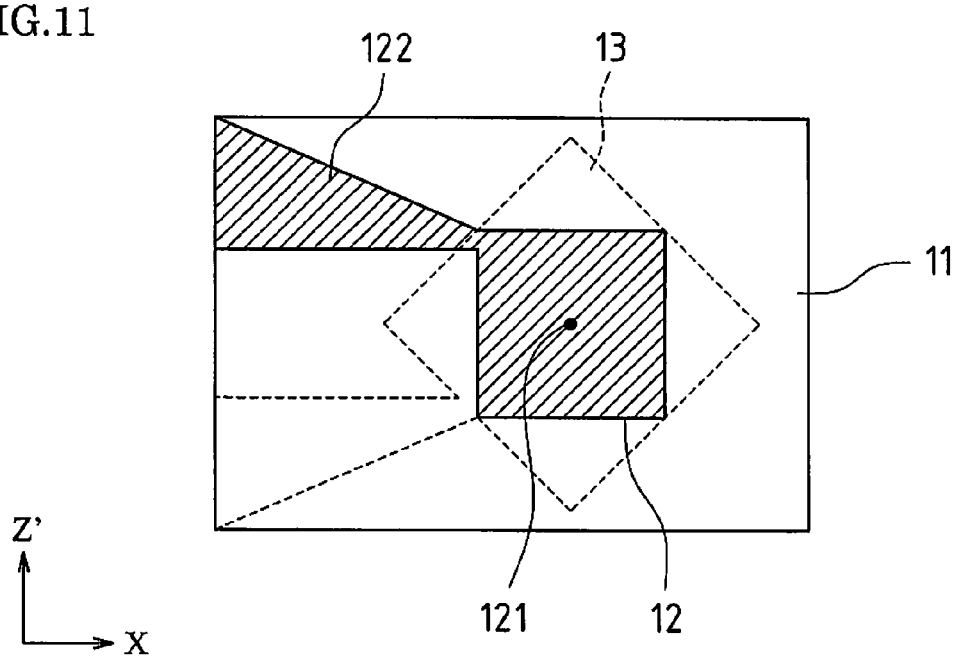
FIG. 11 is a schematic plan view of a piezoelectric plate that is a variation of the piezoelectric plate according to Embodiment 1.
Figure 12:
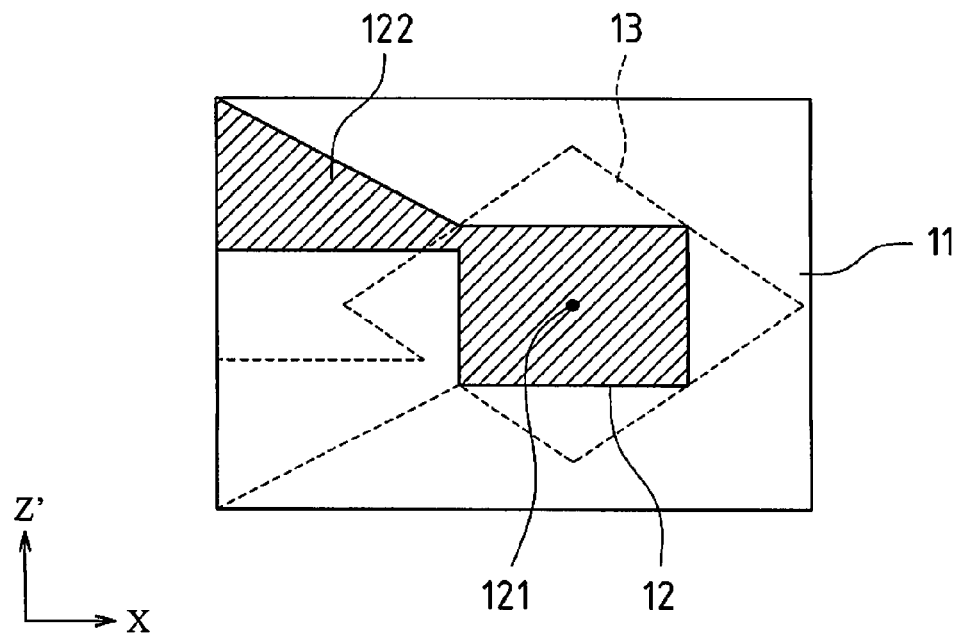
FIG. 12 is a schematic plan view of a piezoelectric plate that is a variation of the piezoelectric plate according to Embodiment 1.

In contrast, as shown in FIGS. 11 and 12, the corners of the front-side driving electrode 12 may be in contact with the sides of the back-side driving electrode 13 when the crystal resonator is viewed from above. It should be noted that in FIG. 11, the driving electrodes 12 and 13 are formed in the shape of a rectangle (square) when viewed from above; in FIG. 12, the driving electrode 12 is formed such that it has a rectangular shape consisting of two long sides and two short sides when viewed from above, and the driving electrode 13 is formed in the shape of a rhombus when viewed from above. As for the relationship between the driving electrodes 12 and 13 of FIGS. 11 and 12, the driving electrode 12 is inscribed in the perimeter of the driving electrode 13 when viewed from above.

When the driving electrode 12 is inscribed in the driving electrode 13 or circumscribes the electrode 13 as described above, the electrode area of one of the front and back driving electrodes 12 and 13 can be increased, whereby it becomes easy to make their placement in adjusting frequencies.

Next, Embodiment 2 differing from Embodiment 1 in structure will be described below.

Embodiment 2

Figure 13:
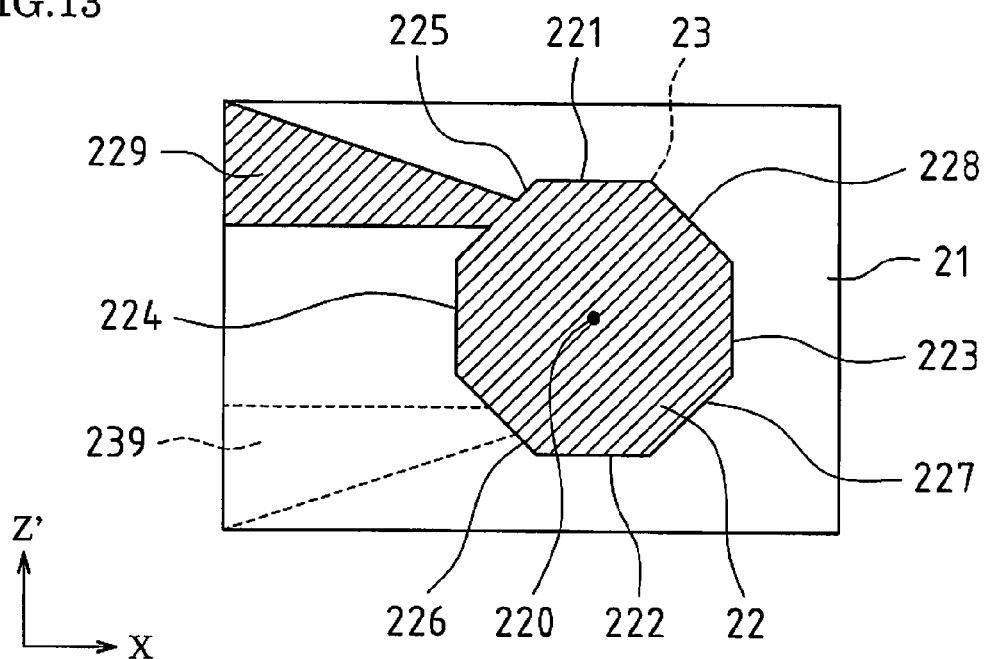
FIG. 13 is a schematic plan view of a piezoelectric plate according to Embodiment 2 of the invention.
Figure 14:
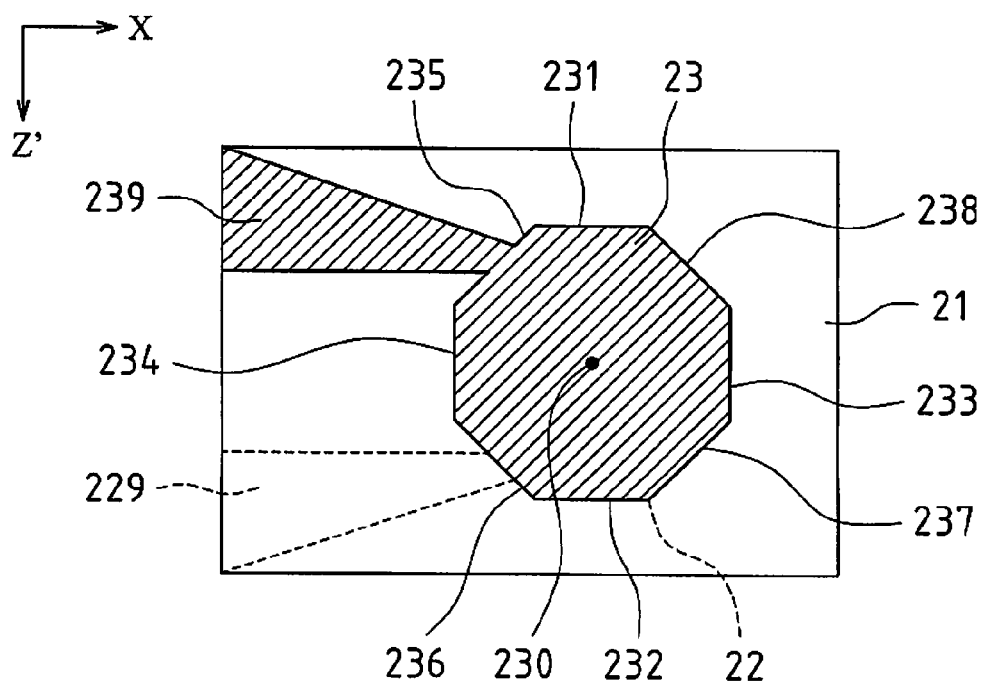
FIG. 14 is a bottom view of the piezoelectric plate of FIG. 13.

In the following, Embodiment 2 of the present invention will be described with reference to the drawings. In this embodiment, a case will be described where structures according to the invention is applied to AT-cut crystal resonator that operates in a thickness-shear vibration mode. FIG. 13 is a plan view of a piezoelectric plate according to Embodiment 2 of the invention, and FIG. 14 is a bottom view of the piezoelectric plate of FIG. 13.

As the piezoelectric plate 21 a rectangular and flat-shaped, AT-cut crystal plate (that generates thickness-shear vibration) is used; in the central regions of its front and back sides, driving electrodes 22 and 23 are formed such that they have a substantially octagonal shape when viewed from above. The driving electrodes 22 and 23 have the same shape and the same area, for example, and are formed such that their centers 220 and 230 directly face each other with the piezoelectric plate 21 disposed therebetween (the front and back driving electrodes 22 and 23 are disposed at the same place, that is, coincide with each other when the crystal plate 21 is viewed from above). The piezoelectric plate 21 is provided such that the direction of its long side represents the X-axis and the direction of its short side represents the Z'-axis, for example; a pair of parallel sides 221 and 222 of the driving electrode 22 and a pair of parallel sides 231 and 232 of the driving electrode 23 are formed parallel with the X-axis; and a pair of parallel sides 223 and 224 of the driving electrode 22 and a pair of parallel sides 233 and 234 of the driving electrode 23 are formed parallel with the Z'-axis. The other sides 225, 226, 227, and 228 of the driving electrode 22 and the other sides 235, 236, 237, and 238 of the driving electrode 23 are formed such that they aren't parallel with the X-axis nor the Z'-axis. All the sides 221 to 228 and 231 to 238 of these driving electrodes 22 and 23 are of the same length.

Moreover, lead electrodes 229 and 239 are formed from the driving electrodes 22 and 23 to the perimeter of the piezoelectric plate 21. The driving electrodes and the lead electrodes each have a laminated structure (in which a chromium layer and a gold layer are disposed, for example) and are formed by vacuum evaporation or sputtering; however, metallic materials for these electrodes are not limited to such metals.

The piezoelectric plate 21 is mounted in a package (not shown), such as a ceramic package, in a manner that electromechanically joins the plate 21 to the package with a conductive resin adhesive or a conductive bonding agent such as a metal bump or a plating bump. Then a specified stabilizing treatment, such as a heat treatment, is conducted, following which the mouth of the package is hermetically sealed with a covering (not shown) by means of seam joining, beam joining, brazing, glass sealing, or the like, whereby the fabrication of the piezoelectric resonator (in this case, the AT-cut crystal resonator) is completed.

In such a piezoelectric plate 21, the front and back driving electrodes 22 and 23 are formed such that they have the same substantially octagonal shape when viewed from above and face each other, the parallel sides 221 and 222 of the driving electrode 22 and the parallel sides 231 and 232 of the driving electrode 23 are formed parallel with the X-axis, and the parallel sides 223 and 224 of the driving electrode 22 and the parallel sides 233 and 234 of the driving electrode 23 are formed parallel with the Z'-axis; therefore the suppression of its main vibration can be eliminated. And further, none of the other sides 225, 226, 227, and 228 of the driving electrode 22 and none of the other sides 235, 236, 237, and 238 of the driving electrode 23 are formed parallel with either the X-axis or the Z'-axis, and all the sides 221 to 228 and 231 to 238 of the driving electrodes 22 and 23 are of the same length; therefore spurious vibration displacement regions extending in the directions of the X-axis and Z'-axis of the piezoelectric plate 21 can be reduced most reliably and efficiently, which achieves the implementation of the driving electrode structure of the piezoelectric resonator in which the effect of suppressing spurious vibrations is heightened.

The piezoelectric plate 21 according to this embodiment is rectangular in shape, and the direction of its long sides represents the X-axis and the direction of its short sides represents the Z'-axis; the short sides of the piezoelectric plate 21, the parallel sides 223 and 224 of the driving electrode 22, and the parallel sides 233 and 234 of the driving electrode 23 are made parallel to one another; and the long sides of the piezoelectric plate 21, the parallel sides 221 and 222 of the driving electrode 22, and the parallel sides 231 and 232 of the driving electrode 23 are made parallel to one another.

In this case, the areas of the driving electrodes 22 and 23 can be extended up to the vicinity of the perimeter of the piezoelectric plate 21 without hindering the miniaturization of the plate 21, and the vibration displacement of the main vibration generated by the driving electrodes 22 and 23 thus designed is obstructed by the perimeter of the piezoelectric plate 21, whereby the main vibration is not suppressed.

Figure 15:
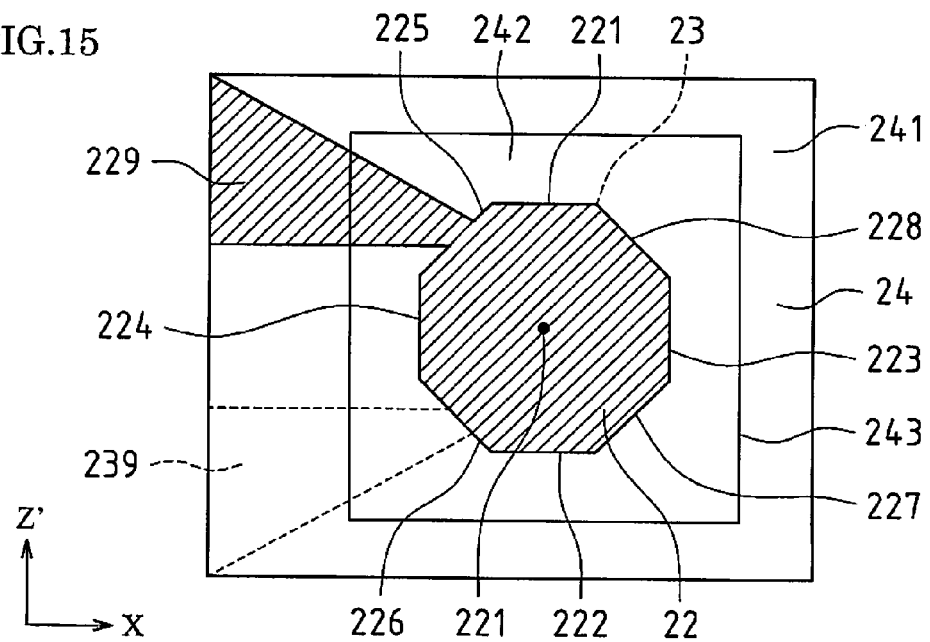
FIG. 15 is a schematic plan view of a piezoelectric plate according to Embodiment 2-2 of the invention.
Figure 16:
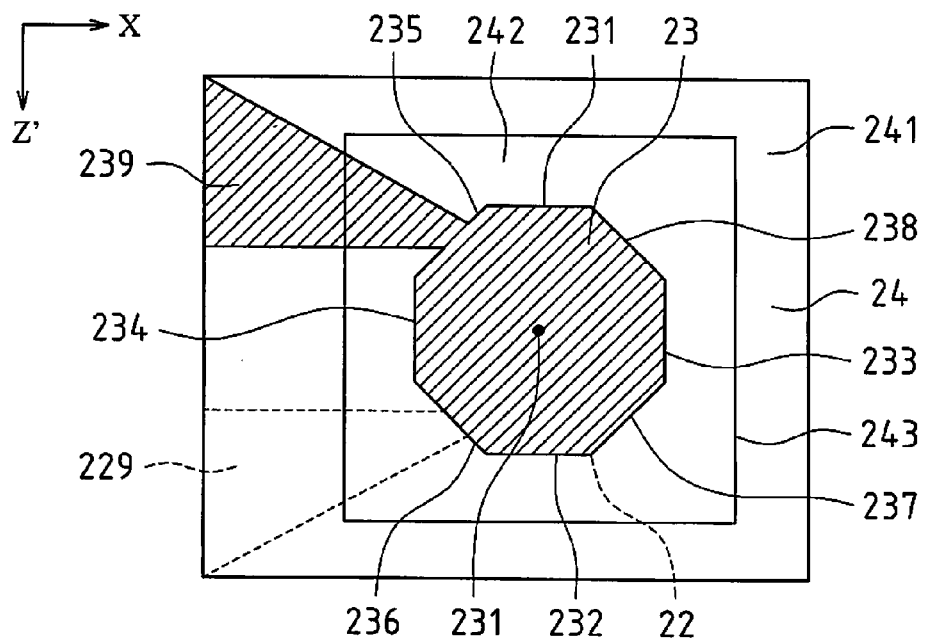
FIG. 16 is a bottom view of the piezoelectric plate of FIG. 15.

Next, another resonator according to Embodiment 2 (a resonator according to Embodiment 2-2) of the present invention will be described below with reference to the drawings. FIG. 15 is a plan view of the surface-mounted crystal resonator according to Embodiment 2-2, and FIG. 16 is a bottom view of the crystal resonator of the FIG. 15. In these figures, components that are the same as those described in Embodiment 2 are assigned the same reference numerals; incidentally, their explanation will be partly omitted.

In Embodiment 2-2 according to the invention, as shown in FIGS. 15 and 16, as a piezoelectric plate 24 a plate that is not flat in shape unlike the plate according to Example 2, i.e., is shaped like an inverted mesa is used; that is, at the center and the perimeter of the piezoelectric plate 24, a thin vibration region 242 and a thick frame region 241 are formed respectively. In other words, in piezoelectric plates 24 formed for high frequency applications, they have often been made recently such that only vibration regions are formed thinly by etching, that is, they are shaped like a so-called inverted mesa.

In such an inverted mesa-shaped piezoelectric plate 24, a boundary portion between the perimetric thick frame region 241 and the thin vibration region 242, i.e., a step-height portion 243 is formed squarely along the X-axis and the Z'-axis, and on the frontside and backside of the thin vibration region 242, the driving electrodes 22 and 23 are formed such that they are shaped into a substantially equilateral octagon when viewed from above. In addition, the piezoelectric plate 24 is provided such that the direction of its long sides represents the X-axis and the direction of its short sides represents the Z'-axis, for example.

The driving electrodes 22 and 23 are formed such that they have the same shape and area, for example. And further, the driving electrodes 22 and 23 are formed facing each other with their central points 221 and 231 directly facing the central point (not shown) of the thin vibration region 242 of the piezoelectric resonator 24. The parallel sides 221 and 222 of the driving electrode 22 and the parallel sides 231 and 232 of the driving electrode 23 are formed parallel with the X-axis, but the parallel sides 223 and 224 of the driving electrode 22 and the parallel sides 233 and 234 of the driving electrode 23 are formed parallel with the Z'-axis. The other sides 225, 226, 227, and 228 of the driving electrode 22 and the other sides 235, 236, 237, and 238 of the driving electrode 23 are formed such that they are parallel with neither the X-axis nor the Z'-axis. In addition, all the sides 221 to 228 and 231 to 238 of the driving electrodes 22 and 23 are of the same length.

Through the use of such a structure, at the inverted mesa-shaped piezoelectric plate 24 for high frequency applications as well, spurious vibration can be suppressed extremely easily and efficiently; that is, the suppression of its main vibration can be eliminated as in the case of Embodiment 2. In addition, the other sides 225, 226, 227, and 228 of the driving electrode 22 and the other sides 235, 236, 237, and 238 of the driving electrode 23 are formed such that none of them is parallel with either the X-axis or the Z'-axis, and all the sides 221 to 228 and 231 to 238 of the driving electrodes 22 and 23 are of the same length; therefore spurious vibration displacement regions extending in the directions of the X-axis and the Z'-axis of the piezoelectric plate 24 can be reduced most reliably and efficiently, which achieves the implementation of the driving electrode structure of the piezoelectric resonator in which the effect of suppressing spurious vibrations is increased.

Moreover, in the piezoelectric plate 24, the boundary portion between the perimetric thick frame region 241 and the thin vibration region 242, i.e., the step-height portion 243 is formed such that it is square in shape and is parallel with the X-axis and the Z'-axis; two sides of the step-height portion 243, the parallel sides 221 and 222 of the driving electrode 22, and the parallel sides 231 and 232 of the driving electrode 23 are made parallel to one another; and the other two sides of the step-height portion 243, the parallel sides 223 and 224 of the driving electrode 22, and the parallel sides 233 and 234 of the driving electrode 23 are made parallel to one another. Therefore the areas of the driving electrodes 22 and 23 can be extended up to the vicinity of the perimeter of the piezoelectric plate 24. And further, the vibration displacement of the main vibration generated by the driving electrodes 22 and 23 thus designed is obstructed by the step-height portion 243 of the piezoelectric plate 24, and therefore the main vibration is not suppressed.

As described above, the driving electrodes 22 and 23 have the same shape and area, for example, and are formed facing each other with their central points 221 and 231 directly facing the central point of the thin vibration region 242 of the piezoelectric plate 24. Because of this, at the center of the vibration region 242 of the piezoelectric plate 24, variations in plane parallelism attributed to a difference in etching rates etc. occur less easily. Therefore, by facing the centers of the driving electrodes 22 and 23 to the center of the vibration region 242, the influence of the spurious vibrations attributed to the variations in the plane parallelism can be curbed more efficiently. In particular, when the piezoelectric plate 24 made of crystal or the like is shaped into the inverted mesa shape by wet etching, a sloped thickness decrement region is formed near the boundary between the thin vibration region 242 and the thick frame region 241 (near the step-height portion 243) due to the difference in the etching rates, and therefore there is apprehension that the plane parallelism of the vibration region 242 varies. Thus, in order to suppress the spurious vibrations, it is most preferable to form the driving electrodes 22 and 23 at the center of the vibration region 242 unaffected by such a thickness decrement region.

Figure 17:
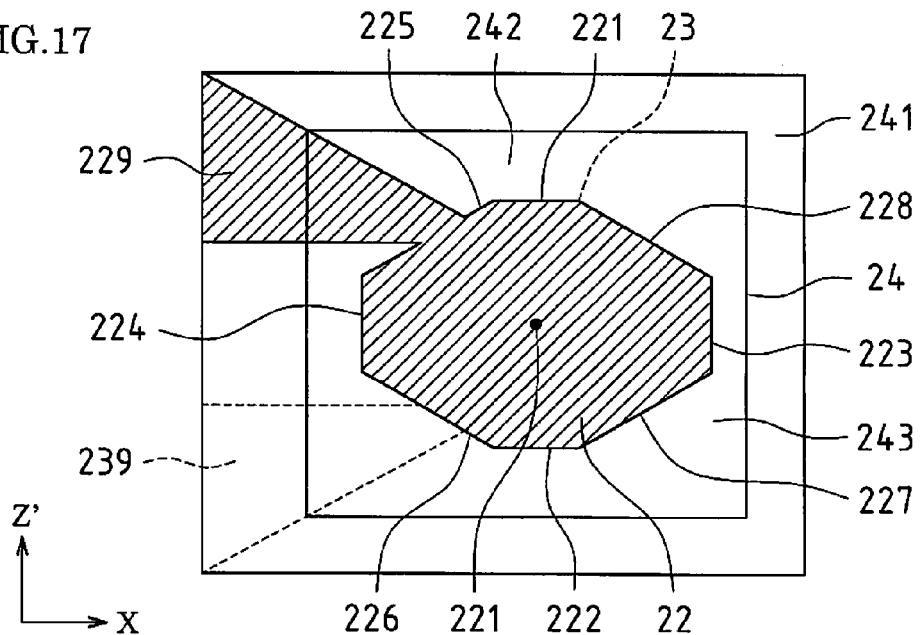
FIG. 17 is a schematic plan view of a piezoelectric plate according to Embodiment 2-3 of the invention.
Figure 18:
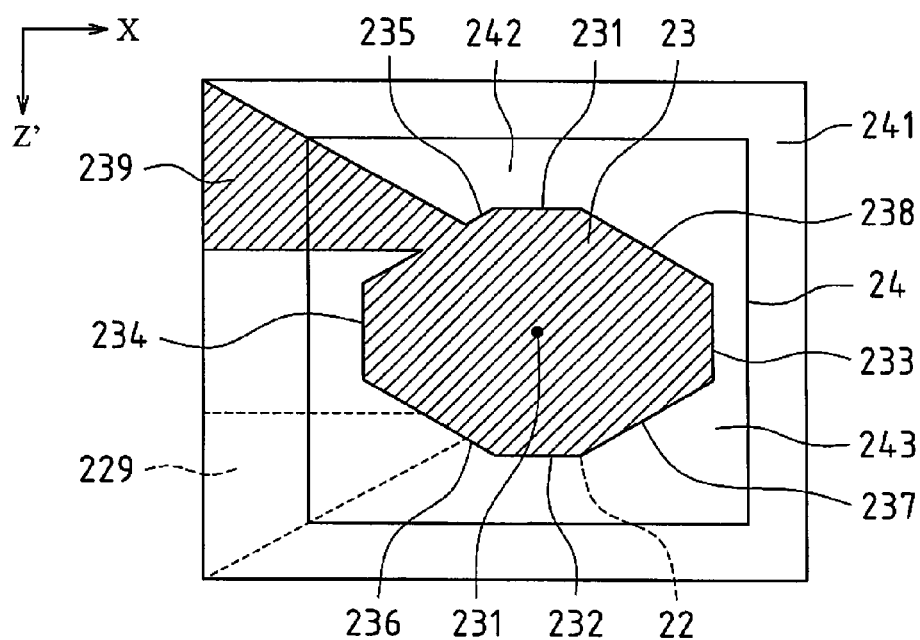
FIG. 18 is a bottom view of the piezoelectric plate of FIG. 17.

Moreover, in Embodiment 2.2, although the driving electrodes 22 and 23, having the shape of such a substantially equilateral octagon when viewed from above, have been disclosed, the driving electrodes 22 and 23 may be formed such that they are lengthened in the direction of the X-axis as shown in FIGS. 17 and 18 (Embodiment 2-3). In Embodiment 2-3, the sides 221 to 224 and 231 to 234 of the driving electrodes 22 and 23, which are parallel to either the X-axis or the Z'-axis, are of the same length; the sides 225 to 228 and 235 to 238 of the driving electrodes 22 and 23, which are not parallel with either axis, are of the same length; and the sides 225 to 228 and 235 to 238 being not parallel with either axis are made longer than the sides 221 to 224 and 231 to 234.

By forming such a structure, the same spurious vibration-suppressing effect as that described in Embodiment 2-2 can be obtained. If the sides not parallel with either axis are shorter than the sides parallel with either axis, the effect of suppressing spurious vibrations having vibration displacement distribution near the perimeter of the driving electrodes 22 and 23 is reduced. It should be noted that unlike those of FIGS. 17 and 18, the driving electrodes 22 and 23 may be lengthened in the direction of the Z'-axis.

Figure 19:
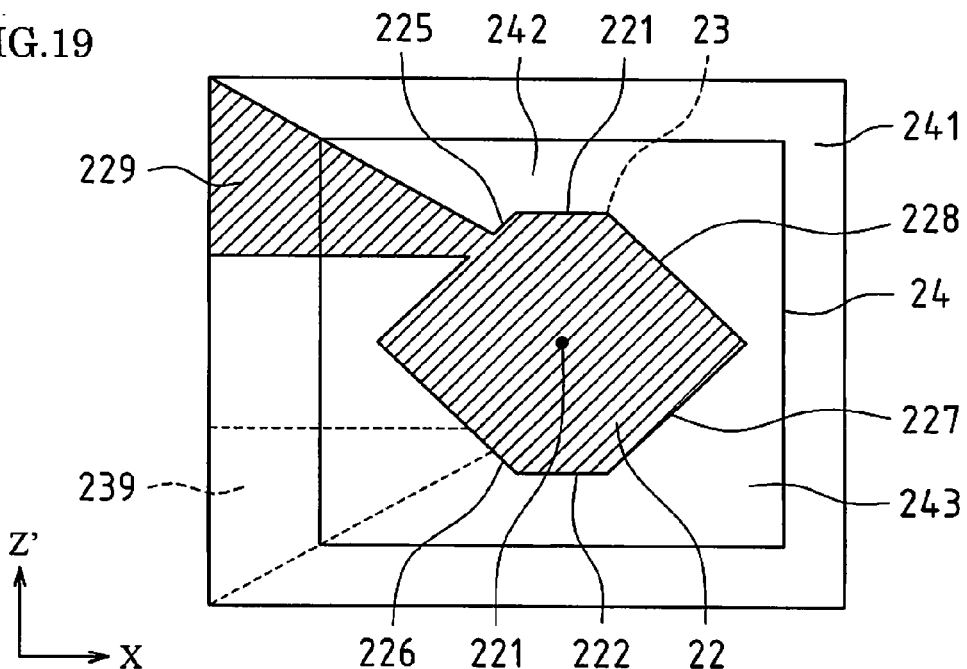
FIG. 19 is a schematic plan view of a piezoelectric plate according to Embodiment 2-4 of the invention.
Figure 20:
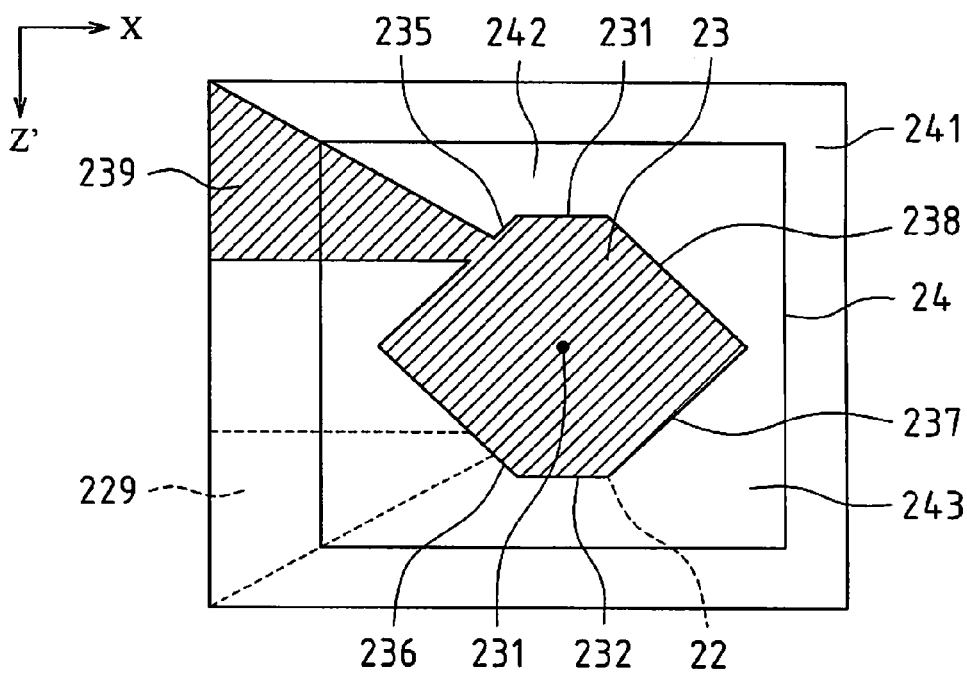
FIG. 20 is a bottom view of the piezoelectric plate of FIG. 19.

In addition, although the driving electrodes 22 and 23 each having the parallel sides along the X-axis and the parallel sides along the Z'-axis have been disclosed in Embodiment 2-2, their shape is not limited to such a configuration; they only have to have at least one pair of parallel sides. For example, as shown in FIGS. 19 and 20, the driving electrodes 22 and 23 may have a substantially hexagonal shape when viewed from above (Embodiment 2-4).

That is, the driving electrodes 22 and 23 have the same shape and area, and face each other with their central points 221 and 231 directly facing the central point (not shown) of the thin vibration region 242 of the piezoelectric plate 21. The piezoelectric plate 24 is provided such that the direction of its long sides represents the X-axis and the direction of its short sides represents the Z'-axis for example, and the parallel sides 221 and 222 of the driving electrode 22 and the parallel sides 231 and 232 of the driving electrodes 23 are formed parallel with the X-axis. None of the other sides 225, 226, 227, and 228 of the driving electrode 22 and the other sides 235, 236, 237, and 238 of the driving electrode 23 is formed parallel with either the X-axis or the Z'-axis. The sides 221, 222, 231, and 232 of the driving electrodes 22 and 23 parallel to the X-axis are of the same length; the sides 225 to 228 and 235 to 238 of the driving electrodes 22 and 23 being not parallel with either axis are of the same length; and the sides 225 to 228 and 235 to 238 being not parallel with either axis are longer than the parallel sides 221, 222, 231, and 232. By forming such a structure, the same spurious vibration-suppressing effect as that described in Embodiment 2-2 can be obtained.

Comparative evaluations of the capabilities of the resonators according to the invention described in Embodiments 2, 2-2, 2-3, and 2-4 and the conventional resonators (see Table 8) were done. The evaluated capabilities were the series resonance resistance values (the so-called C1 values) of their main vibrations, the series resonance resistance values of their spurious vibrations, and the ratios between both the resistance values.

Invention J is a piezoelectric resonator that vibrates to emit a fundamental wave with a frequency of 200 MHz. Driving electrodes having an equilaterally octagonal shape (the length of each side: 0.124 mm) are formed on a piezoelectric plate fitted to the resonator.

Conventional article G is a piezoelectric resonator that vibrates to emit a fundamental wave with a frequency of 200 MHz. Driving electrodes having a square shape (the length of each side: 0.3 mm) are formed on a piezoelectric plate fitted to the resonator.

Invention K is a piezoelectric resonator that vibrates to emit a fundamental wave with a frequency of 300 MHz. Driving electrodes having an equilaterally octagonal shape (the length of each side: 0.124 mm) are formed on a piezoelectric plate fitted to the resonator.

Conventional article H is a piezoelectric resonator that vibrates to emit a fundamental wave with a frequency of 300 MHz. Driving electrodes having a square shape (the length of each side: 0.3 mm) are formed on a piezoelectric plate fitted to the resonator.

As commonalities between the articles according to the invention and the conventional articles of Table 8, the 0.2-μm-thick driving electrodes are formed on the front and rear surfaces of the AT-cut crystal resonator, and are made by disposing a gold layer on a chromium underlying layer.

From their test results presented in Table 8, it is clear that when compared with the conventional resonators (conventional articles G and H), the resonators according to the invention (inventions J and K) have a much higher ratio between the resistance values of their spurious vibration and main vibration, and therefore it can be seen that their spurious vibration-suppressing effect is enhanced considerably.

The present invention can be practiced in other various forms without departing from the scope or essential characteristics thereof. Therefore the embodiments disclosed above are to be considered in all respects as illustrative and not limiting. The scope of the invention is indicated by the appended claims rather than by the foregoing description, and variations and modifications which come within the meaning and range of equivalency of the claims are intended to be embraced therein.

In addition, the present application claims priority based on Japanese Patent Application No. 2007-203010, filed Aug. 3, 2007, Japanese Patent Application No. 2007-246279, filed Sep. 21, 2007, and Japanese Patent Application No. 2007-254046, filed Sep. 28, 2007. All the contents of the applications mentioned above are incorporated in the application concerned.

INDUSTRIAL APPLICABILITY

The present invention is suitable for crystal resonator in particular.

The invention claimed is:

1. A piezoelectric resonator comprising a pair of driving electrodes and a pair of lead electrodes that are formed facing the frontside and backside of an AT-cut crystal plate that operates in a thickness-shear vibration mode,
    wherein the front and back driving electrodes are formed such that the driving electrodes each have one or more pairs of parallel sides, and the centers of the driving electrodes face each other,
    the parallel sides of one of the front and back driving electrodes (first driving electrode) are formed parallel with the X-axis and the Z'-axis of the AT-cut crystal plate, and
    the parallel sides of the other driving electrode (second driving electrode) are formed without being parallel with the X-axis and Z'-axis of the AT-cut crystal plate.

2. The piezoelectric resonator according to claim 1, wherein the front and back driving electrodes are formed such that the driving electrodes each have one or more pairs of parallel sides, and have the same shape.

3. The piezoelectric resonator according to claim 2, wherein the front and back driving electrodes are formed by rotating the parallel sides of any one of the driving electrodes around their center by an angle of 45° relative to the Z'-axis when viewed from above.

4. A piezoelectric resonator comprising a pair of driving electrodes and a pair of lead electrodes that are formed facing the frontside and backside of an AT-cut crystal plate that operates in a thickness-shear vibration mode,
    wherein one of the front and back driving electrodes (first driving electrode) is formed in a rectangular shape such that the parallel sides of the driving electrode are parallel with the X-axis or the Z'-axis of the AT-cut crystal plate,
    the other (second) driving electrode is formed in a rhombic shape such that the parallel sides of the driving electrode are not parallel with the X-axis and Z'-axis of the AT-cut crystal plate, and
    the center of the rectangular driving electrode and the center of the rhombic driving electrode face each other.

5. The piezoelectric resonator according to claim 1,
    wherein the second driving electrode is made thicker than the first driving electrode.

6. The piezoelectric resonator according to claim 1,
    wherein notches are made at the corners of the driving electrodes.

7. A piezoelectric resonator comprising a pair of driving electrodes and a pair of lead electrodes that are formed facing the frontside and backside of an AT-cut crystal plate that operates in a thickness-shear vibration mode,
    wherein the front and back driving electrodes are formed such that the driving electrodes have the same shape and face each other, and each has one or more pairs of parallel sides formed parallel with either the X-axis or the Z'-axis of the AT-cut crystal plate and four or more sides formed parallel with neither the X-axis nor the Z'-axis thereof and having the same length, and
    the sides being not parallel with the axes are made longer than the parallel sides parallel with the axes.

8. A piezoelectric resonator comprising a pair of driving electrodes and a pair of lead electrodes that are formed on the frontside and backside of an AT-cut crystal plate that operates in a thickness-shear vibration mode,
    wherein the front and back driving electrodes are formed such that the driving electrodes have the same shape, and face each other, and each has one or more pairs of parallel sides formed parallel with either the X-axis or the Z'-axis of the AT-cut crystal plate and four or more sides formed parallel with neither the X-axis nor the Z'-axis thereof and having the same shape, and
    the parallel sides parallel with the axes and the sides being not parallel with the axes have the same length.

* * * * *